(12) United States Patent
Ching et al.

(10) Patent No.: US 10,930,794 B2
(45) Date of Patent: Feb. 23, 2021

(54) SELF-ALIGNED SPACERS FOR MULTI-GATE DEVICES AND METHOD OF FABRICATION THEREOF

(71) Applicant: Taiwan Semiconductor Manufacturing Co., Ltd., Hsin-Chu (TW)

(72) Inventors: Kuo-Cheng Ching, Hsinchu County (TW); Shi Ning Ju, Hsinchu (TW); Guan-Lin Chen, Hsinchu County (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/358,314

(22) Filed: Mar. 19, 2019

(65) Prior Publication Data
US 2020/0006577 A1 Jan. 2, 2020

Related U.S. Application Data

(60) Provisional application No. 62/691,705, filed on Jun. 29, 2018.

(51) Int. Cl.
| | | |
|---|---|---|
| *H01L 29/786* | (2006.01) | |
| *H01L 29/66* | (2006.01) | |
| *H01L 29/423* | (2006.01) | |
| *H01L 29/40* | (2006.01) | |
| *H01L 21/02* | (2006.01) | |

(52) U.S. Cl.
CPC .... *H01L 29/78696* (2013.01); *H01L 21/0262* (2013.01); *H01L 29/401* (2013.01); *H01L 29/42392* (2013.01); *H01L 29/6653* (2013.01); *H01L 29/66545* (2013.01)

(58) Field of Classification Search
None
See application file for complete search history.

(56) References Cited

U.S. PATENT DOCUMENTS

| | | |
|---|---|---|
| 8,796,666 B1 | 8/2014 | Huang et al. |
| 8,822,243 B2 | 9/2014 | Yan et al. |
| 8,987,142 B2 | 3/2015 | Lee et al. |
| 9,093,530 B2 | 4/2015 | Huang et al. |
| 9,053,279 B2 | 6/2015 | Chang et al. |
| 9,099,530 B2 | 8/2015 | Lin et al. |
| 9,153,478 B2 | 10/2015 | Liu et al. |
| 9,501,601 B2 | 11/2016 | Chang et al. |

(Continued)

*Primary Examiner* — Long Pham
(74) *Attorney, Agent, or Firm* — Haynes and Boone, LLP

(57) ABSTRACT

A method of fabricating a semiconductor device includes forming a fin extruding from a substrate, the fin having a plurality of sacrificial layers and a plurality of channel layers, wherein the sacrificial layers and the channel layers are alternately arranged; removing a portion of the sacrificial layers from a channel region of the fin; depositing a spacer material in areas from which the portion of the sacrificial layers have been removed; selectively removing a portion of the spacer material, thereby exposing the channel layers in the channel region of the fin, wherein other portions of the spacer material remain as a spacer feature; and forming a gate structure engaging the exposed channel layers.

20 Claims, 28 Drawing Sheets

(56) References Cited

U.S. PATENT DOCUMENTS

| | | | |
|---|---|---|---|
| 9,548,303 B2 | 1/2017 | Lee et al. | |
| 9,876,114 B2 | 1/2018 | Huang | |
| 10,685,887 B2* | 6/2020 | Smith | H01L 29/0673 |
| 2017/0154973 A1* | 6/2017 | Ching | H01L 21/32053 |
| 2017/0373163 A1* | 12/2017 | Vellianitis | H01L 29/42392 |
| 2018/0166551 A1* | 6/2018 | Ching | H01L 21/845 |
| 2019/0198629 A1* | 6/2019 | Yeung | H01L 29/78681 |
| 2019/0221641 A1* | 7/2019 | Glass | H01L 21/02532 |
| 2019/0312121 A1* | 10/2019 | Vellianitis | H01L 29/66742 |
| 2019/0326288 A1* | 10/2019 | Hashemi | B82Y 10/00 |
| 2020/0006577 A1* | 1/2020 | Ching | H01L 29/66545 |
| 2020/0052132 A1* | 2/2020 | Ching | H01L 21/0262 |
| 2020/0127119 A1* | 4/2020 | Lin | H01L 29/66439 |
| 2020/0168703 A1* | 5/2020 | Rachmady | H01L 29/2006 |
| 2020/0227520 A1* | 7/2020 | Kuhn | H01L 29/41733 |

\* cited by examiner

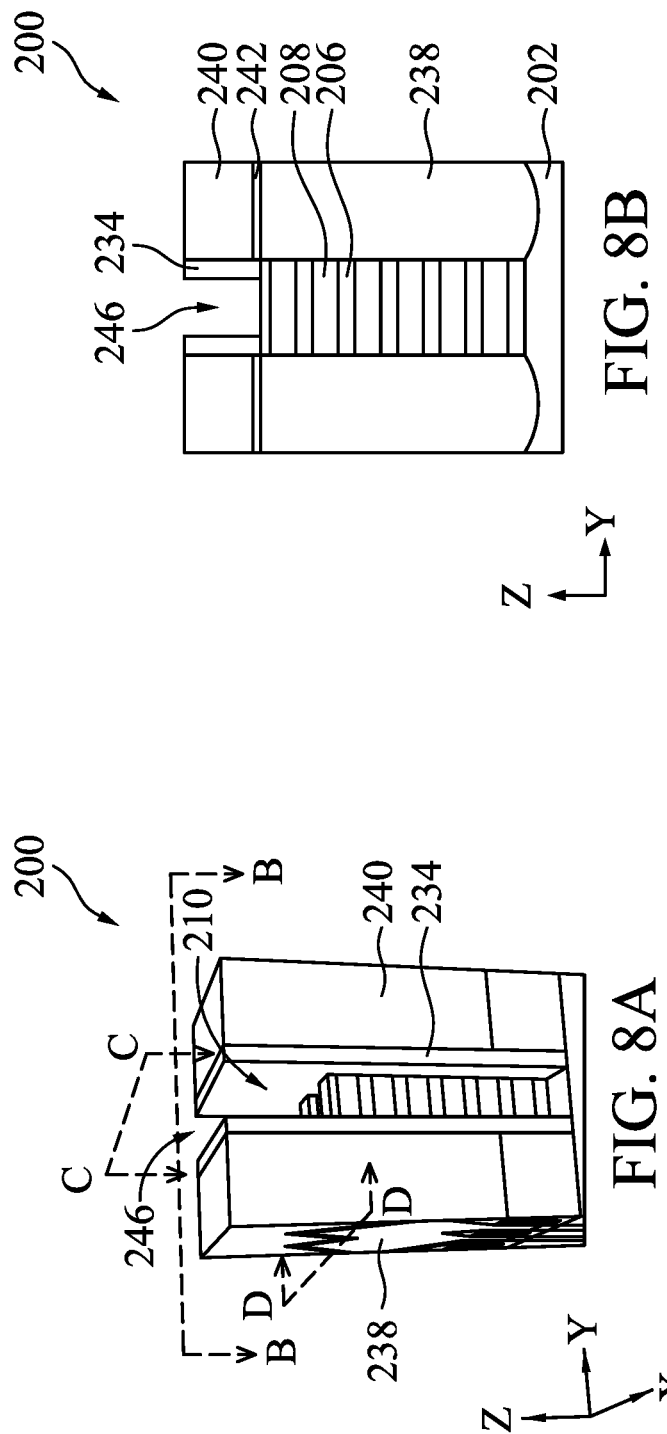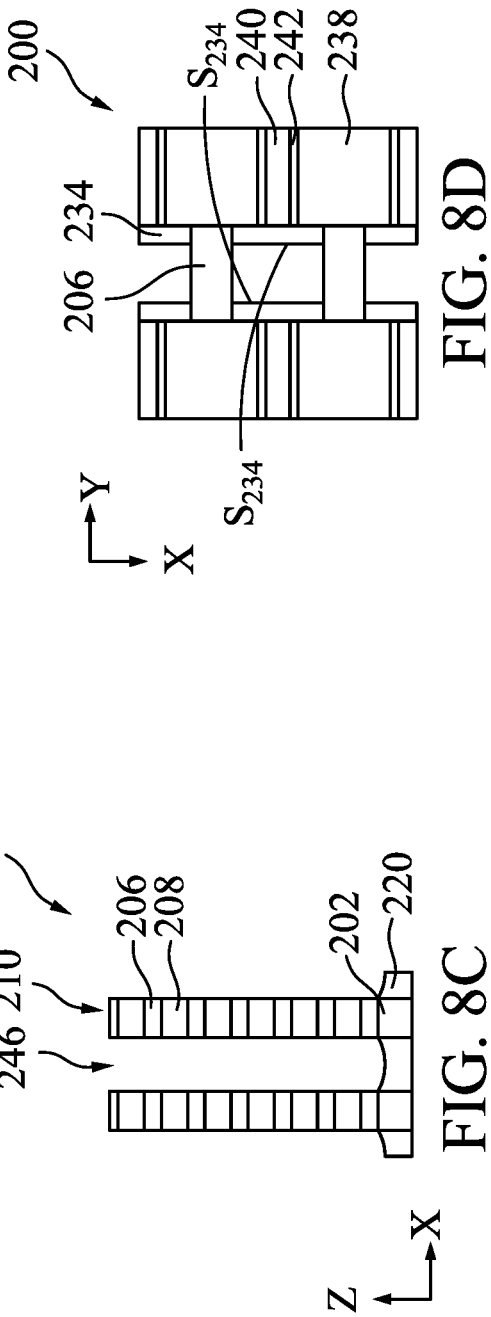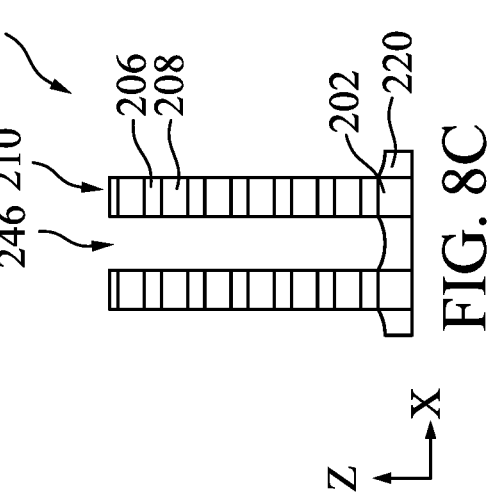

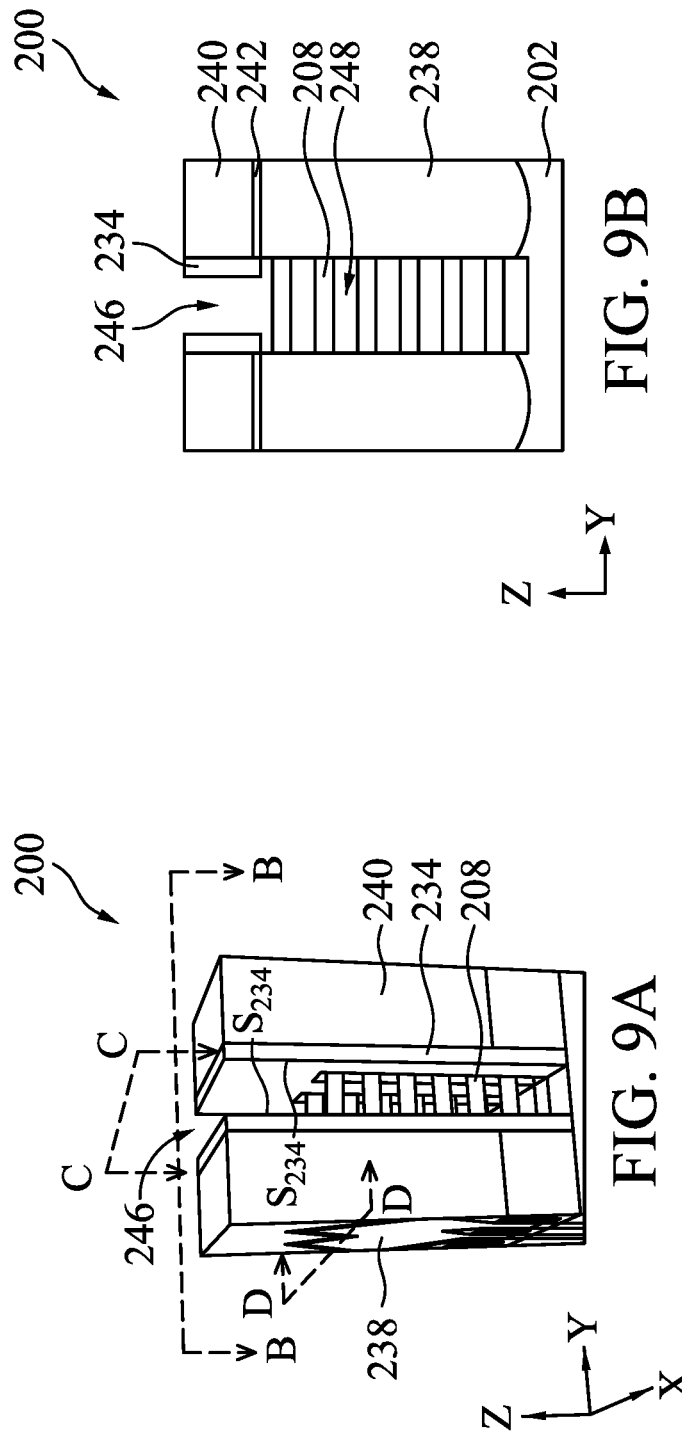
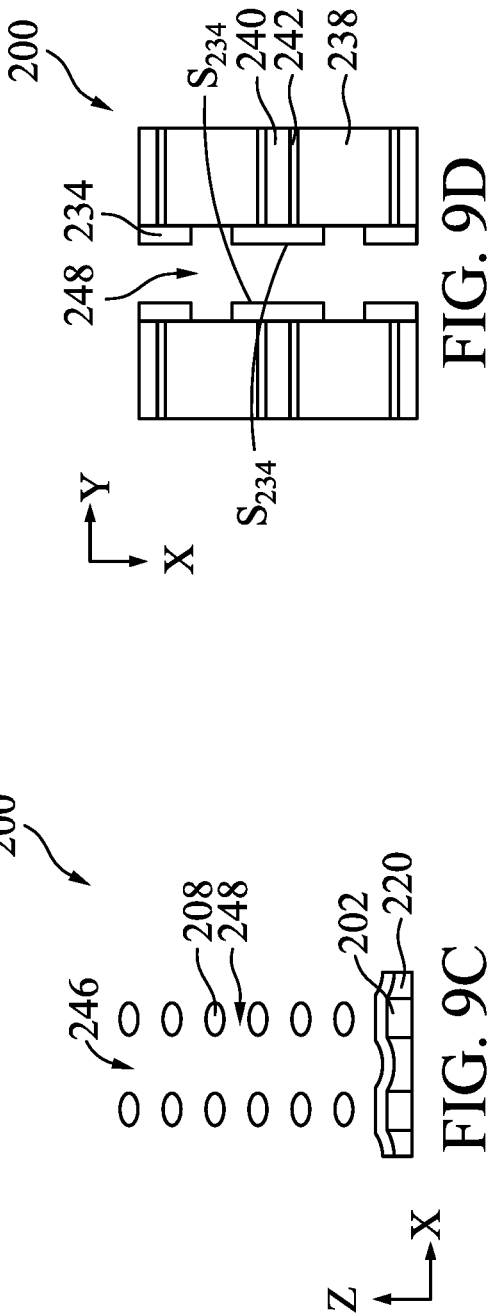
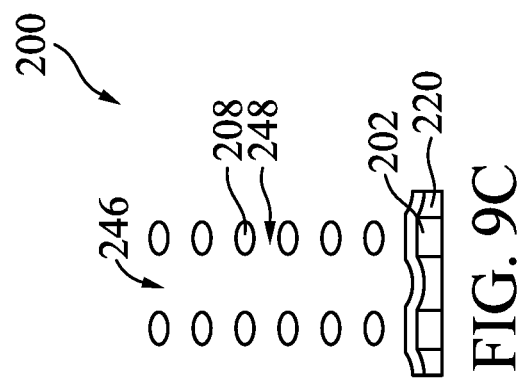
FIG. 9A
FIG. 9B
FIG. 9C
FIG. 9D

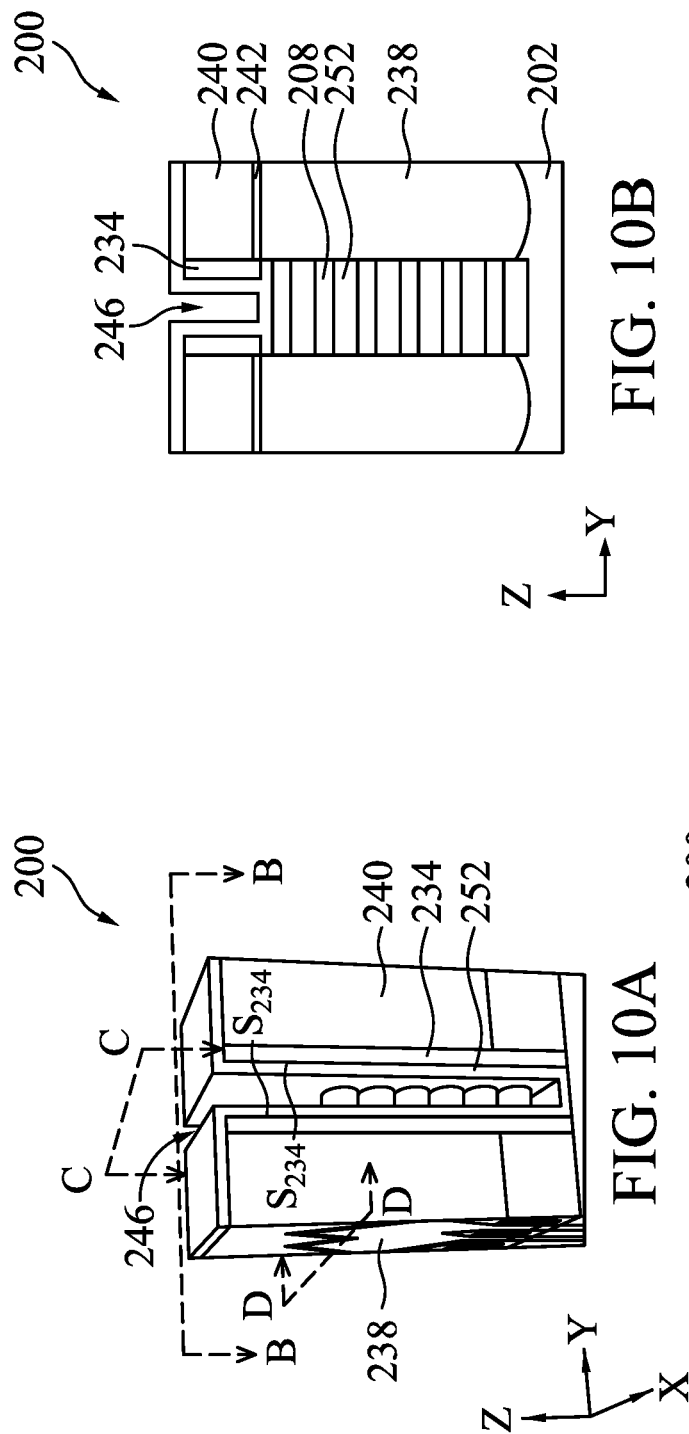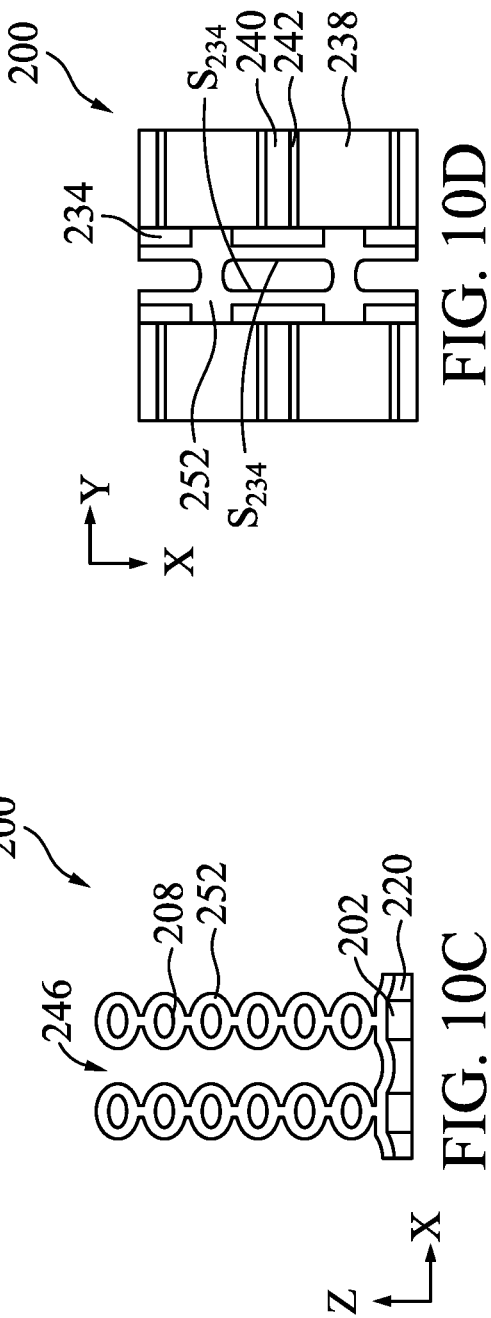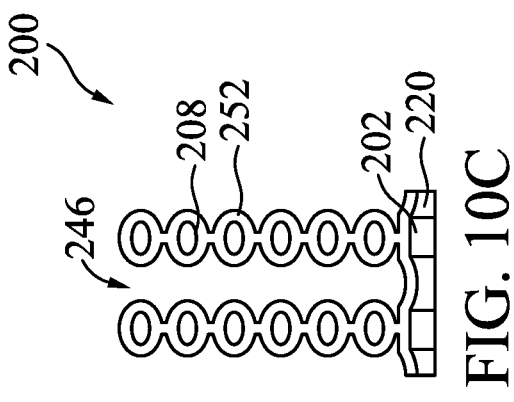

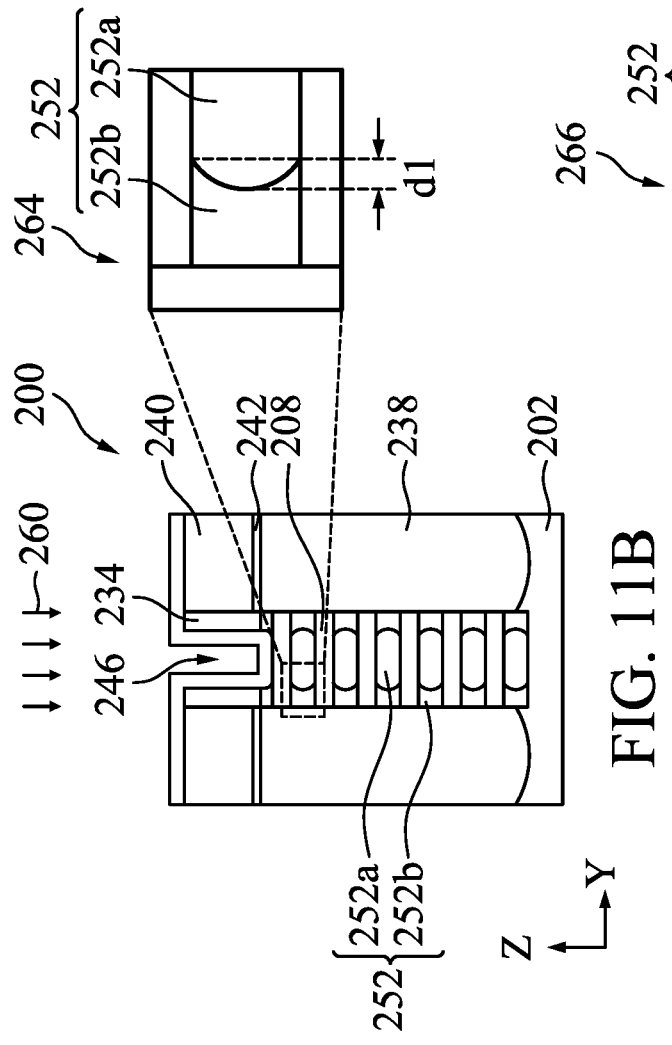
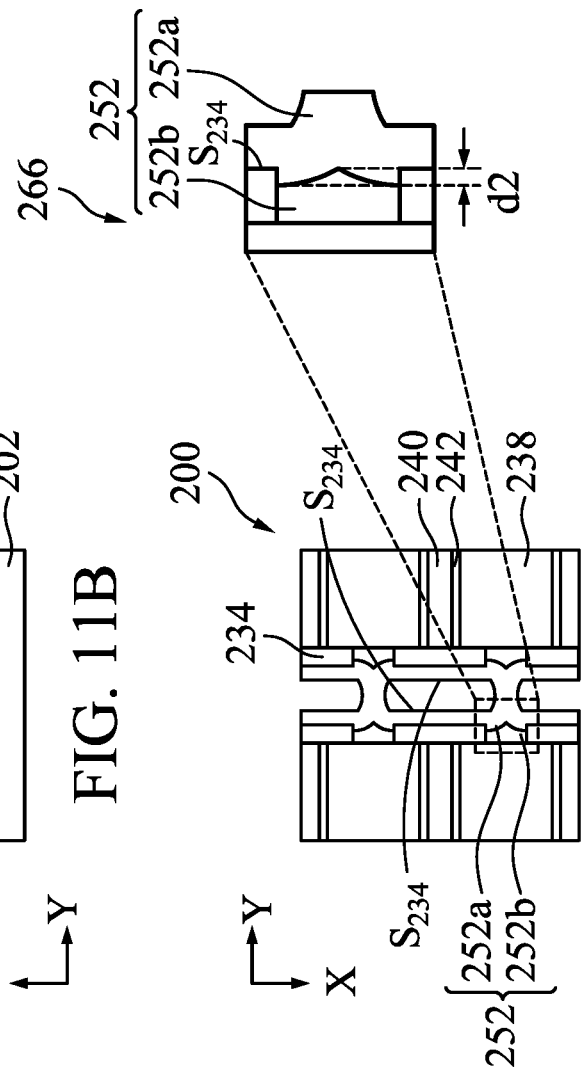
FIG. 11A
FIG. 11B
FIG. 11C
FIG. 11D

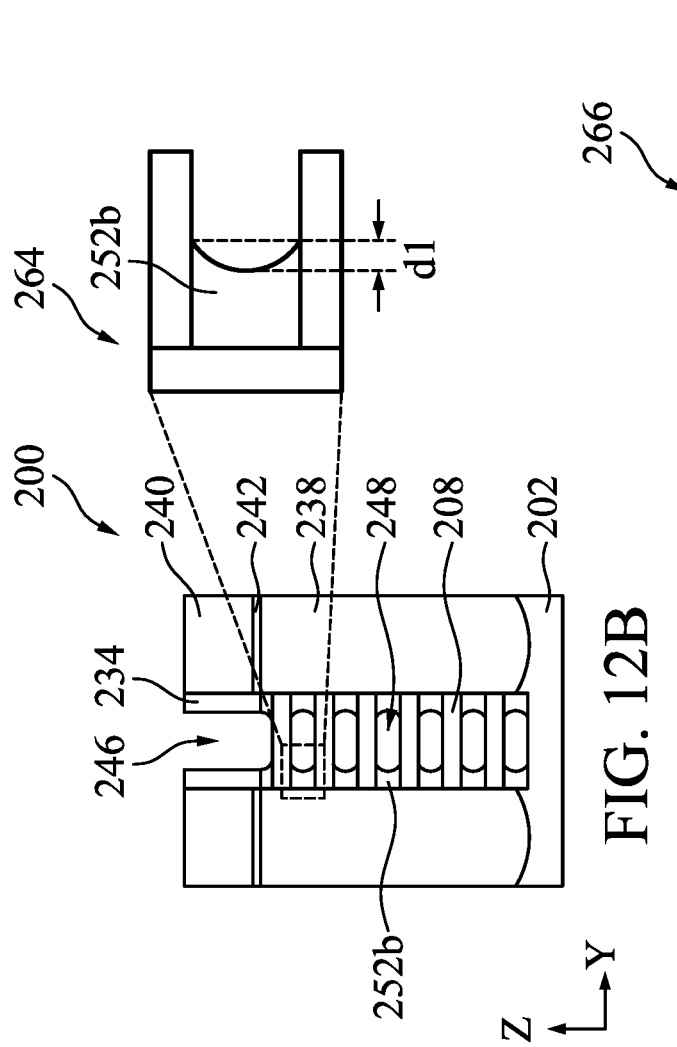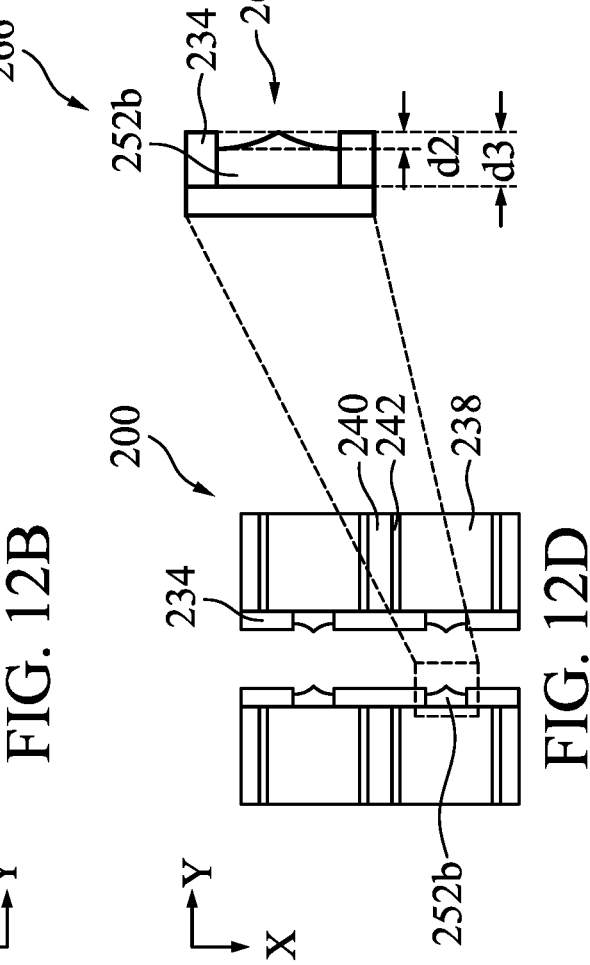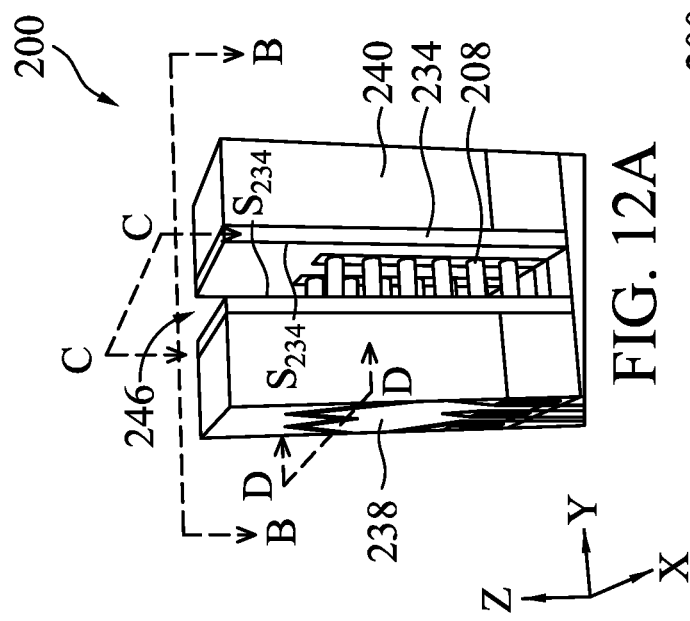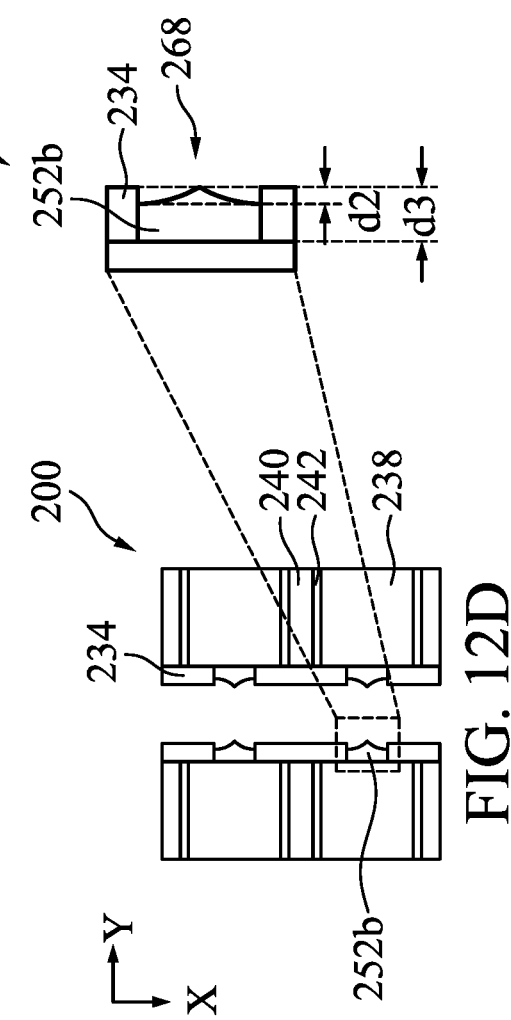
FIG. 12A
FIG. 12B
FIG. 12C
FIG. 12D

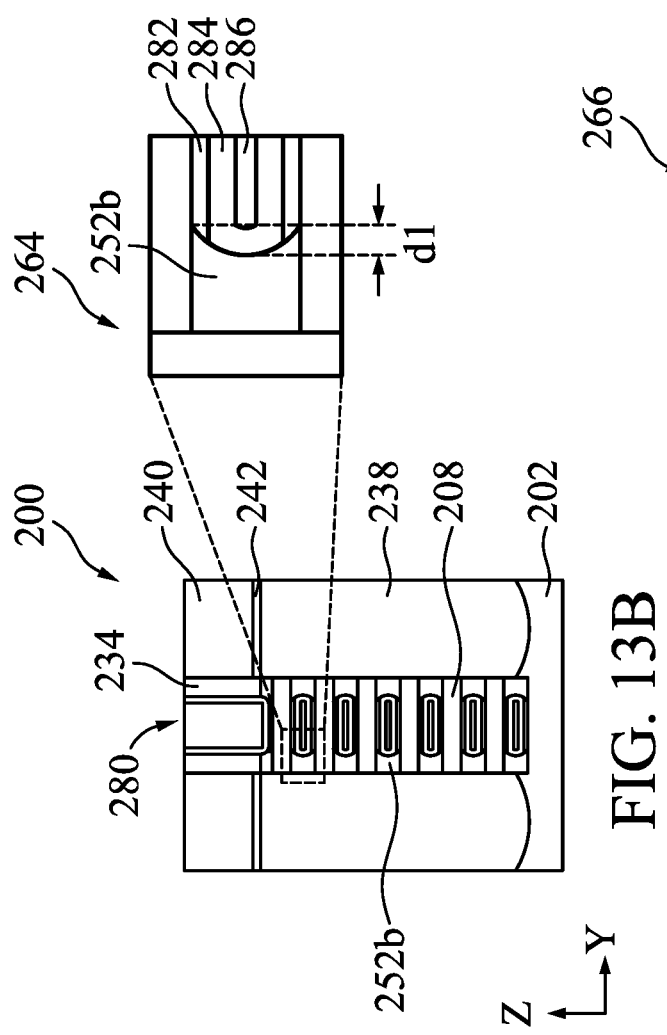
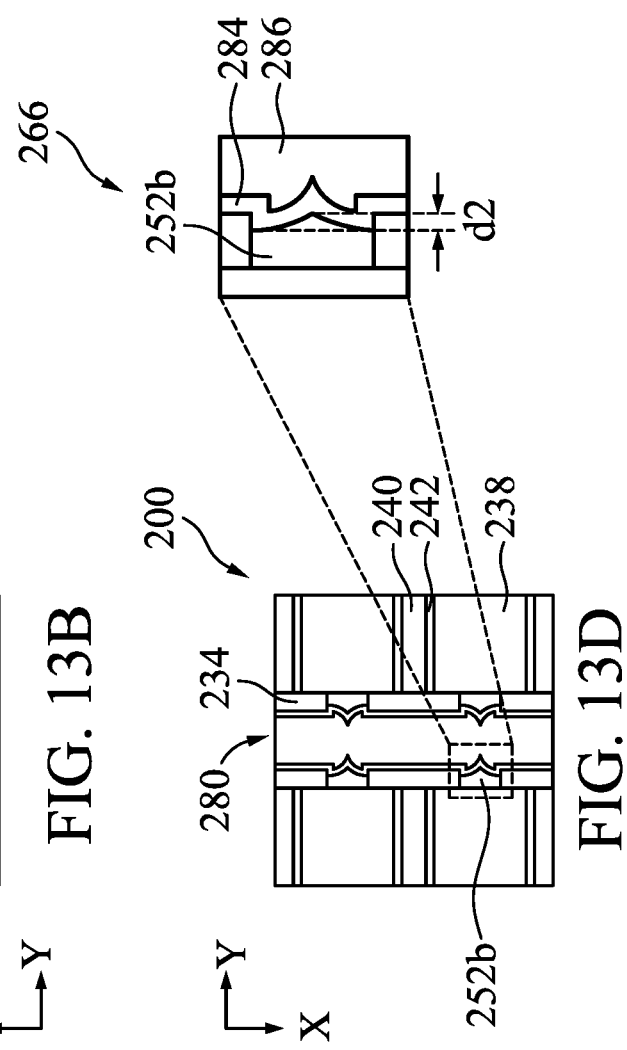
FIG. 13A
FIG. 13B
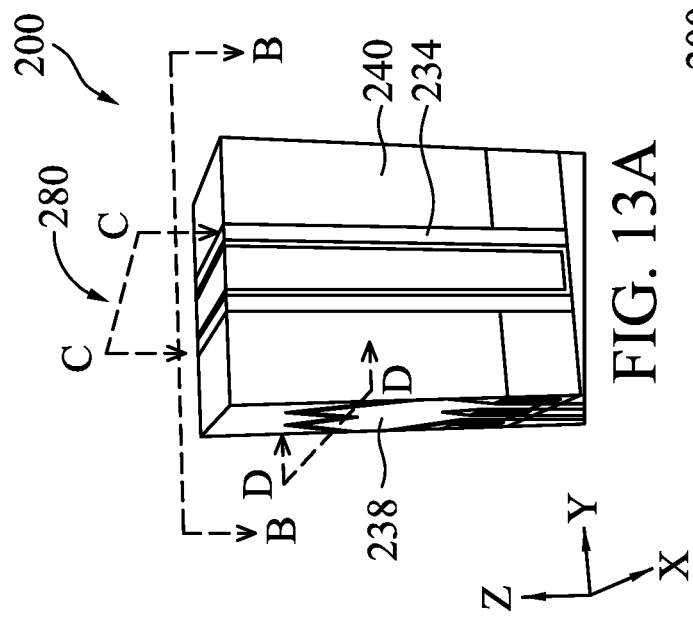
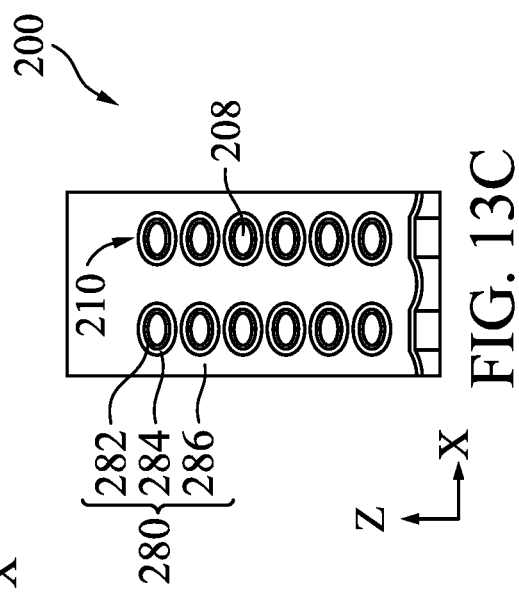
FIG. 13C
FIG. 13D

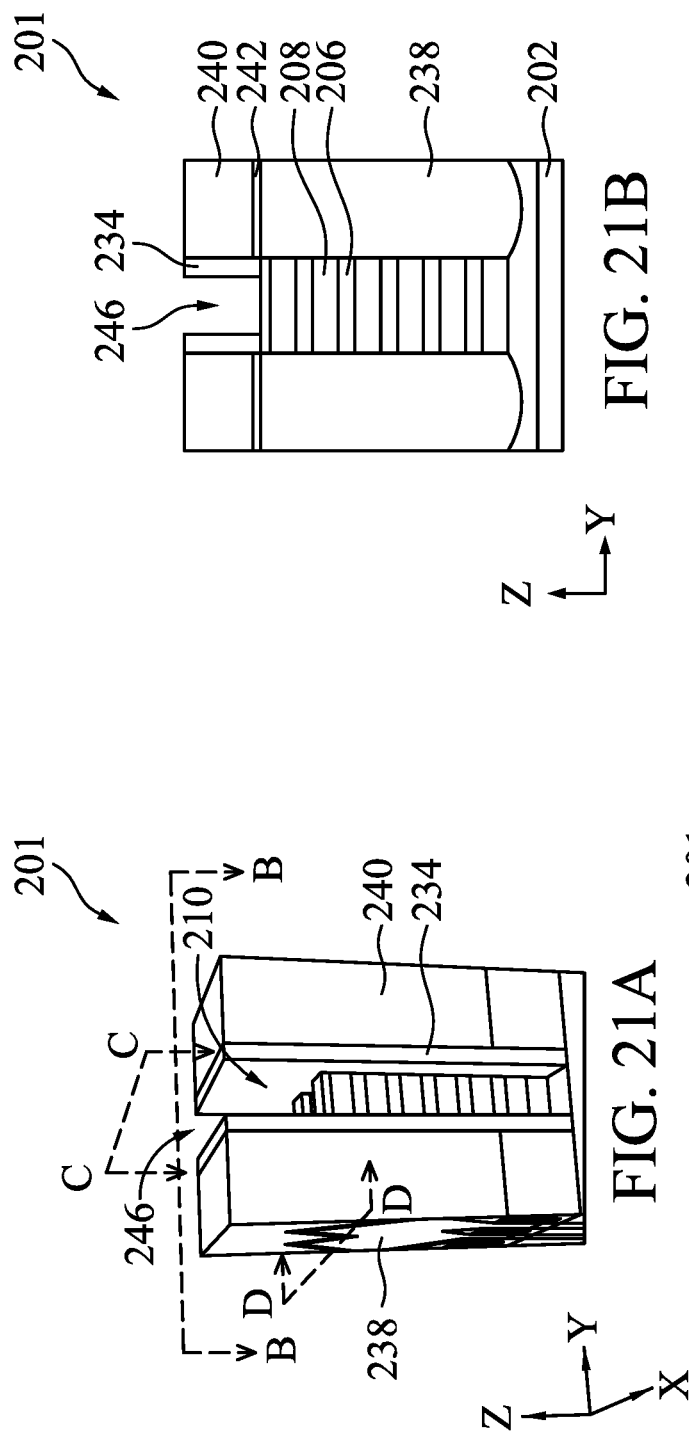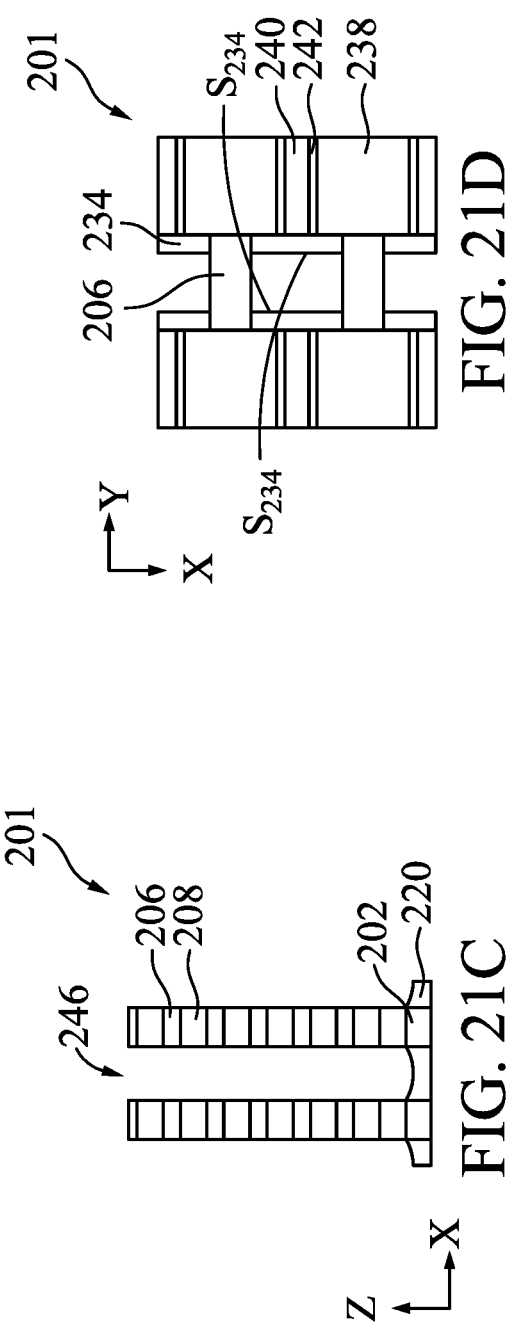

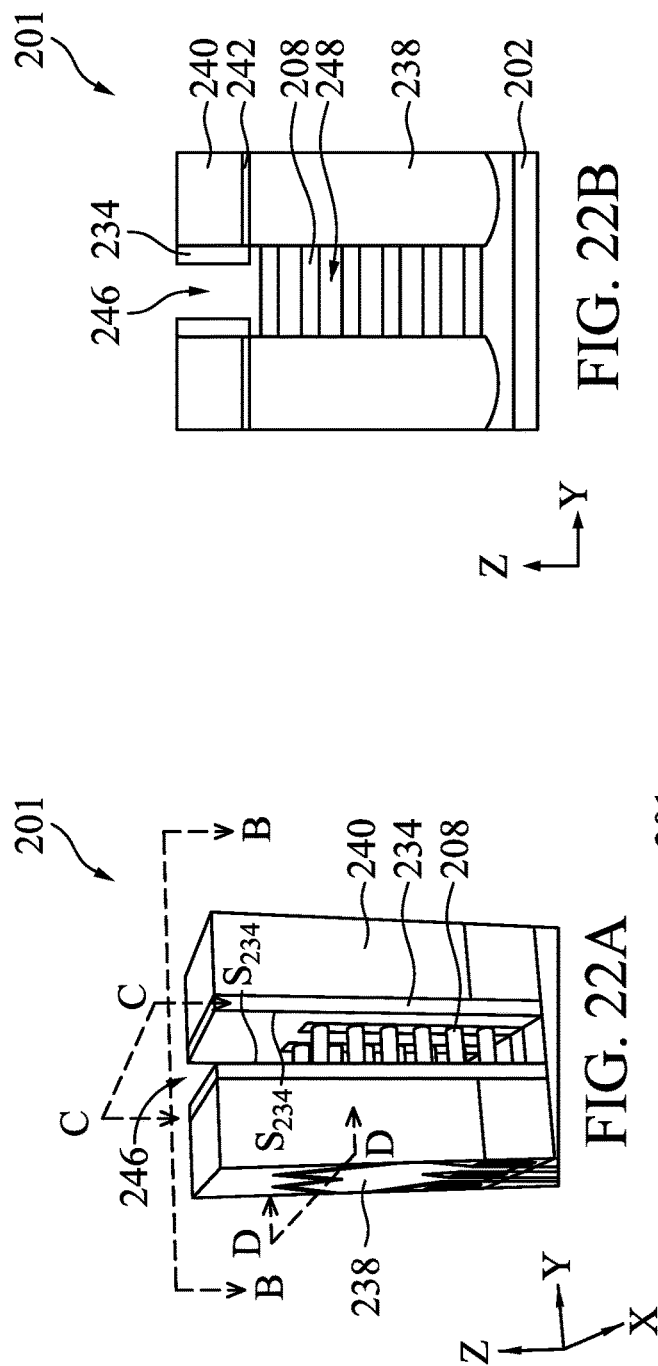
FIG. 22A
FIG. 22B
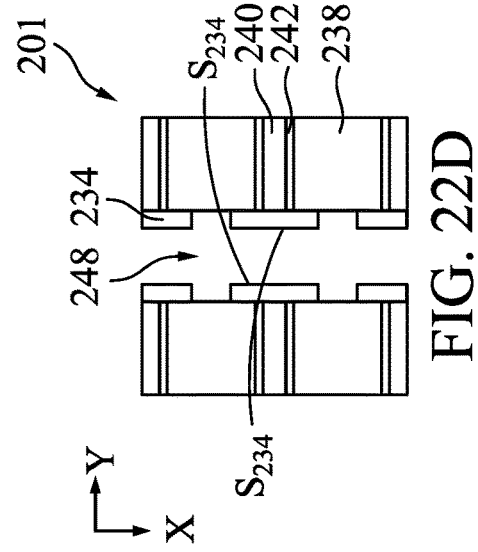
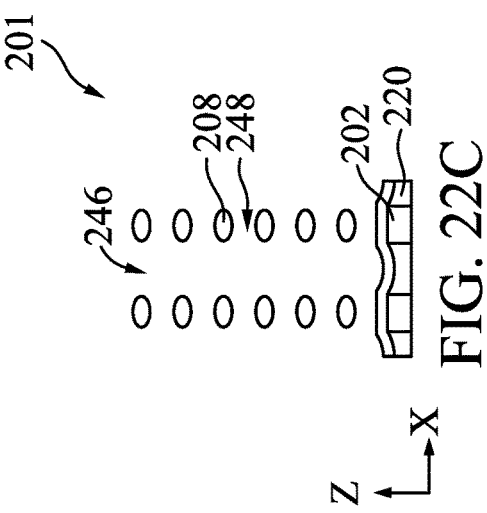
FIG. 22C
FIG. 22D

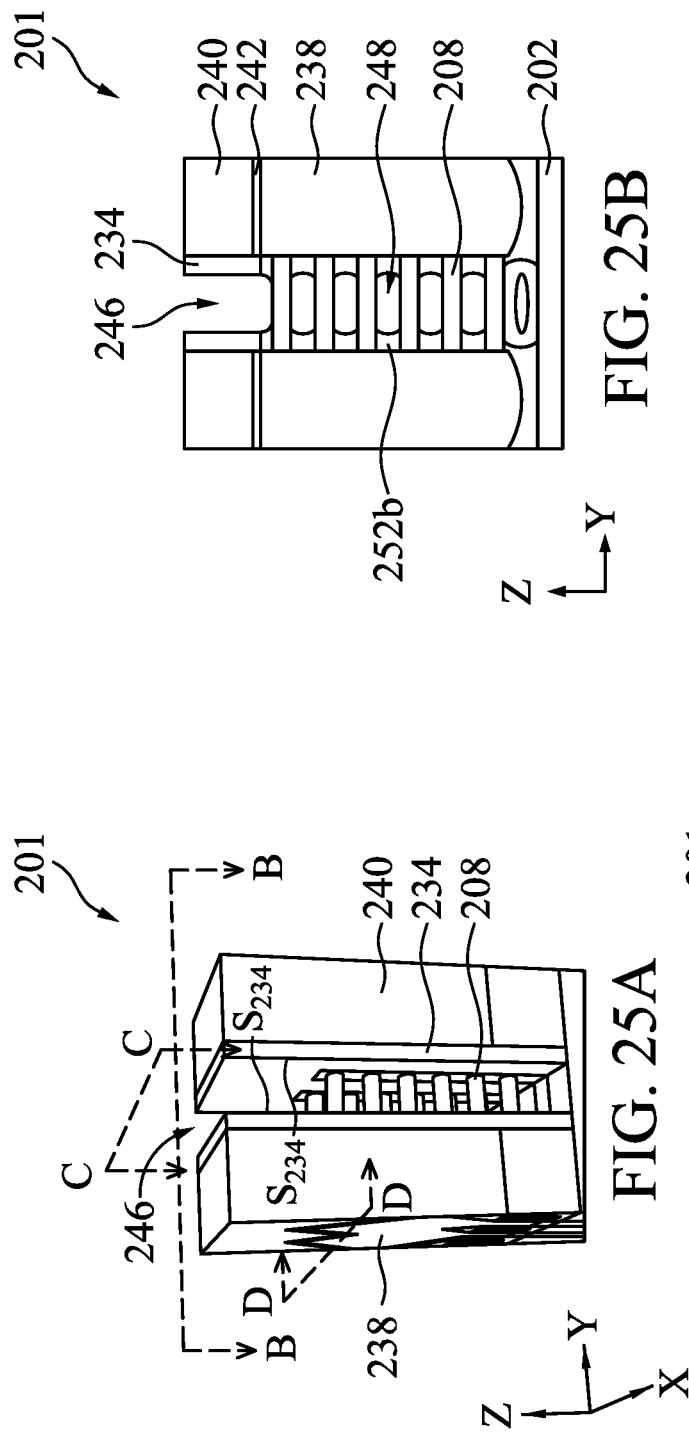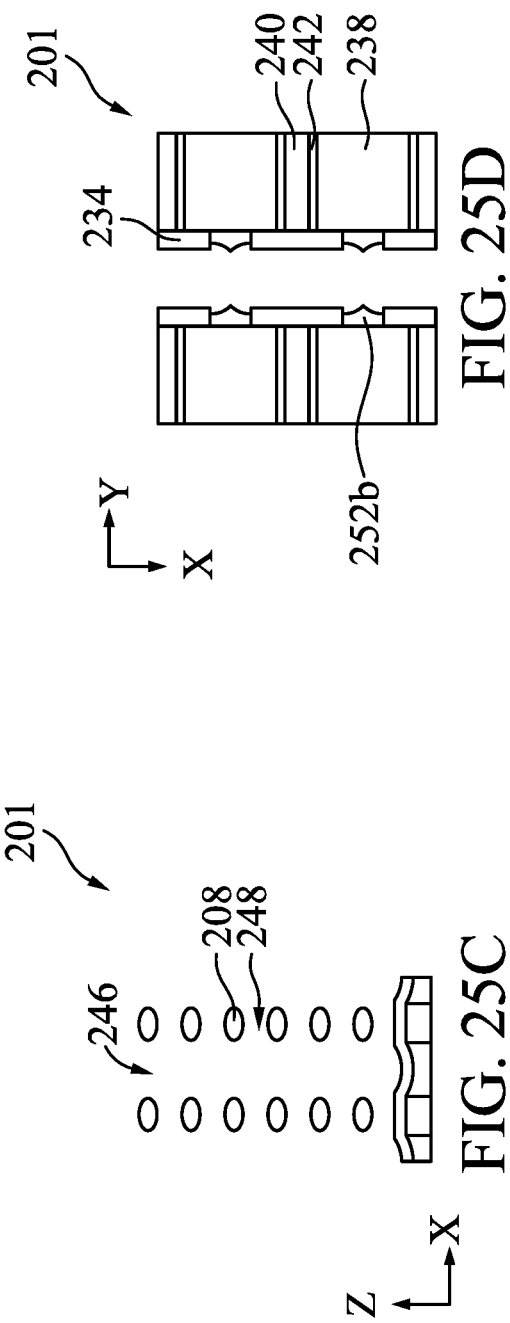

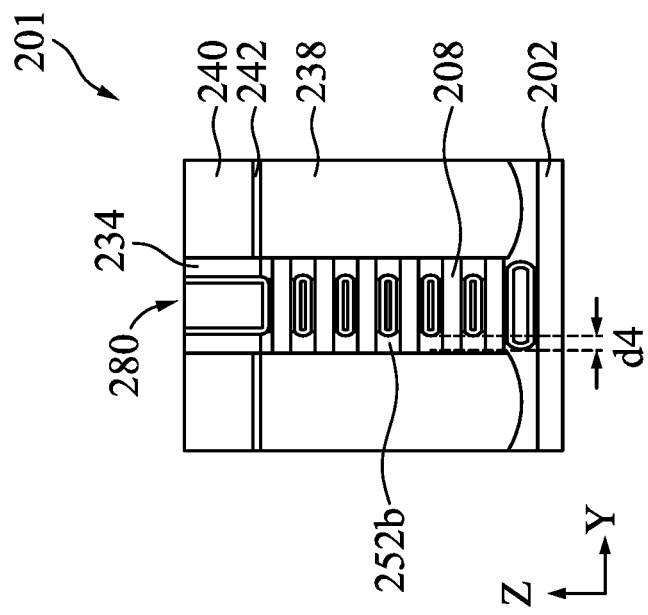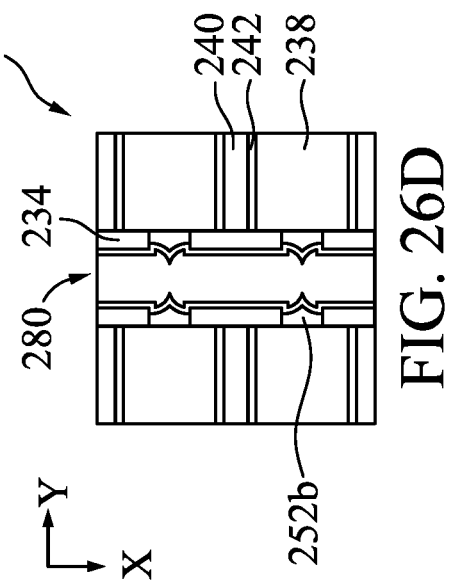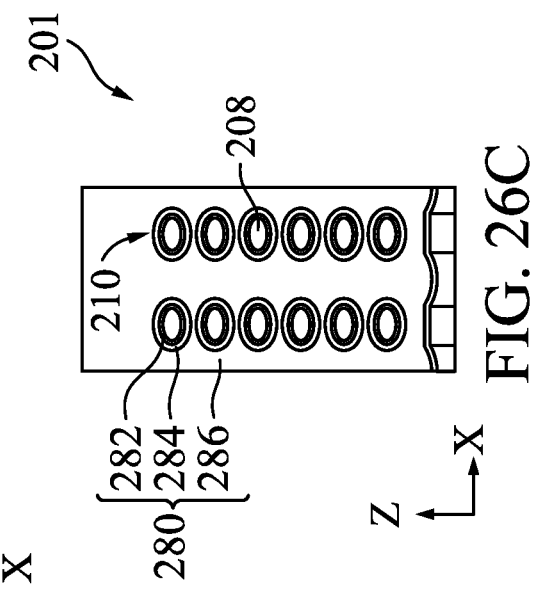

SELF-ALIGNED SPACERS FOR MULTI-GATE DEVICES AND METHOD OF FABRICATION THEREOF

PRIORITY DATA

This application claims priority to U.S. Provisional Patent Application Ser. No. 62/691,705 filed on Jun. 29, 2018, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the gate-all-around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled while maintaining gate control and mitigating SCEs. In conventional processes, GAA devices provide a channel in a stacked nanosheet configuration. Integration of fabricating the GAA features around stacked nanosheets can be challenging. For example, in a stacked nanosheet GAA process flow, inner-spacer formation can be an important process to reduce capacitance and prevent leakage between gate stacks and source/drain (S/D) regions. However, inner-spacer misalignment introduces non-uniformity to GAA devices and may degrade integrated chip performance. Therefore, while the current methods have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4, 5, 6, 7, 8A, 9A, 10A, 11A, 12A, and 13A illustrate perspective views of a semiconductor structure during a fabrication process according to the method of FIGS. 1A and 1B, according to aspects of the present disclosure.

FIGS. 8B, 8C, 8D, 9B, 9C, 9D, 10B, 10C, 10D, 11B, 11C, 11D, 12B, 12C, 12D, 13B, 13C, and 13D illustrate cross-sectional views of a semiconductor structure during a fabrication process according to the method of FIGS. 1A and 1B, according to aspects of the present disclosure.

FIGS. 15, 16, 17, 18, 19, 20, 21A, 22A, 23A, 24A, 25A, and 26A illustrate perspective views of a semiconductor structure during a fabrication process according to the method of FIGS. 14A and 14B, according to aspects of the present disclosure.

FIGS. 21B, 21C, 21D, 22B, 22C, 22D, 23B, 23C, 23D, 24B, 24C, 24D, 25B, 25C, 25D, 26B, 26C, and 26D illustrate cross-sectional views of a semiconductor structure during a fabrication process according to the method of FIGS. 14A and 14B, according to aspects of the present disclosure.

DETAILED DESCRIPTION

Figure 1A:
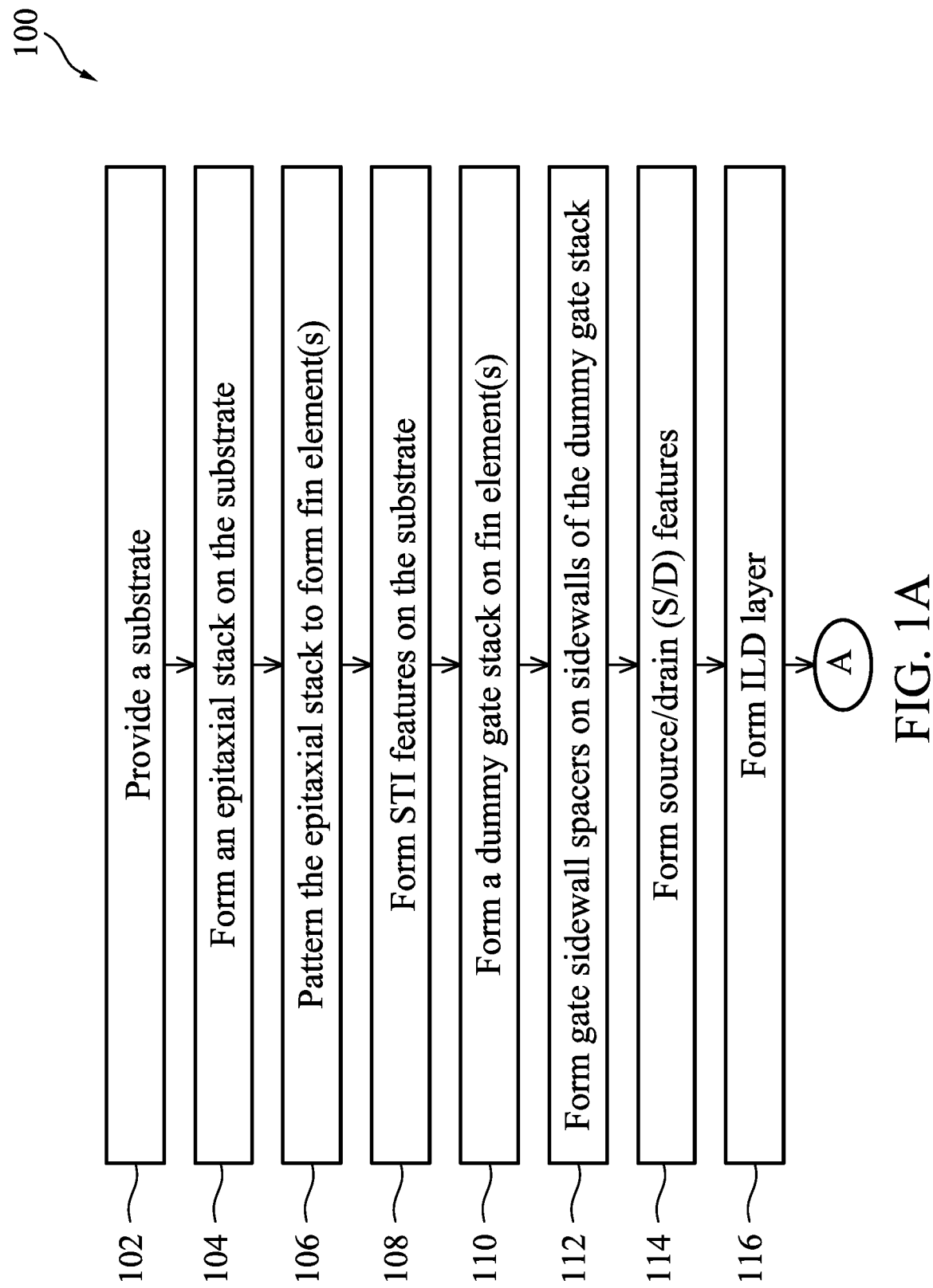
FIGS. 1A and 1B show a flow chart of a method for forming a multi-gate device including inner-spacer features, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating gate-all-around (GAA) transistors with self-aligned inner-spacers. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

As scales of the fin width in fin field effect transistors (FinFET) decreases, channel width variations could cause undesirable variability and mobility loss. GAA transistors, such as nanosheet transistors are being studied as an alternative to fin field effect transistors. In a nanosheet transistor, the gate of the transistor is made all around the channel (e.g., a nanowire channel or a bar-shaped channel) such that the channel is surrounded or encapsulated by the gate. Such a transistor has the advantage of improving the electrostatic control of the channel by the gate, which also mitigates leakage currents. A nanosheet transistor includes an inner spacer and a sidewall spacer (also termed as an outer spacer), among others. An inner spacer is typically formed by an additional process to the sidewall spacer. For example, after making a sidewall spacer and epitaxially growing source/drain (S/D) features, a space for the inner spacer is made by wet or vapor etch removal. Then, the inner spacer is formed by dielectric material deposition. However, a fine control of the space for inner spacer may be challenging during a wet or vapor etch removal, such as due to loading effects. Consequently, the resulting inner spacer may have non-uniform dimensions across different layers of the nanosheets, further causing channel length variation. An object of the present disclosure is to devise a self-aligned inner spacer formation method so as to accurately control dimensions and positions of the inner spacer and to improved channel length uniformity across different layers of the nanosheets.

Figure 1B:
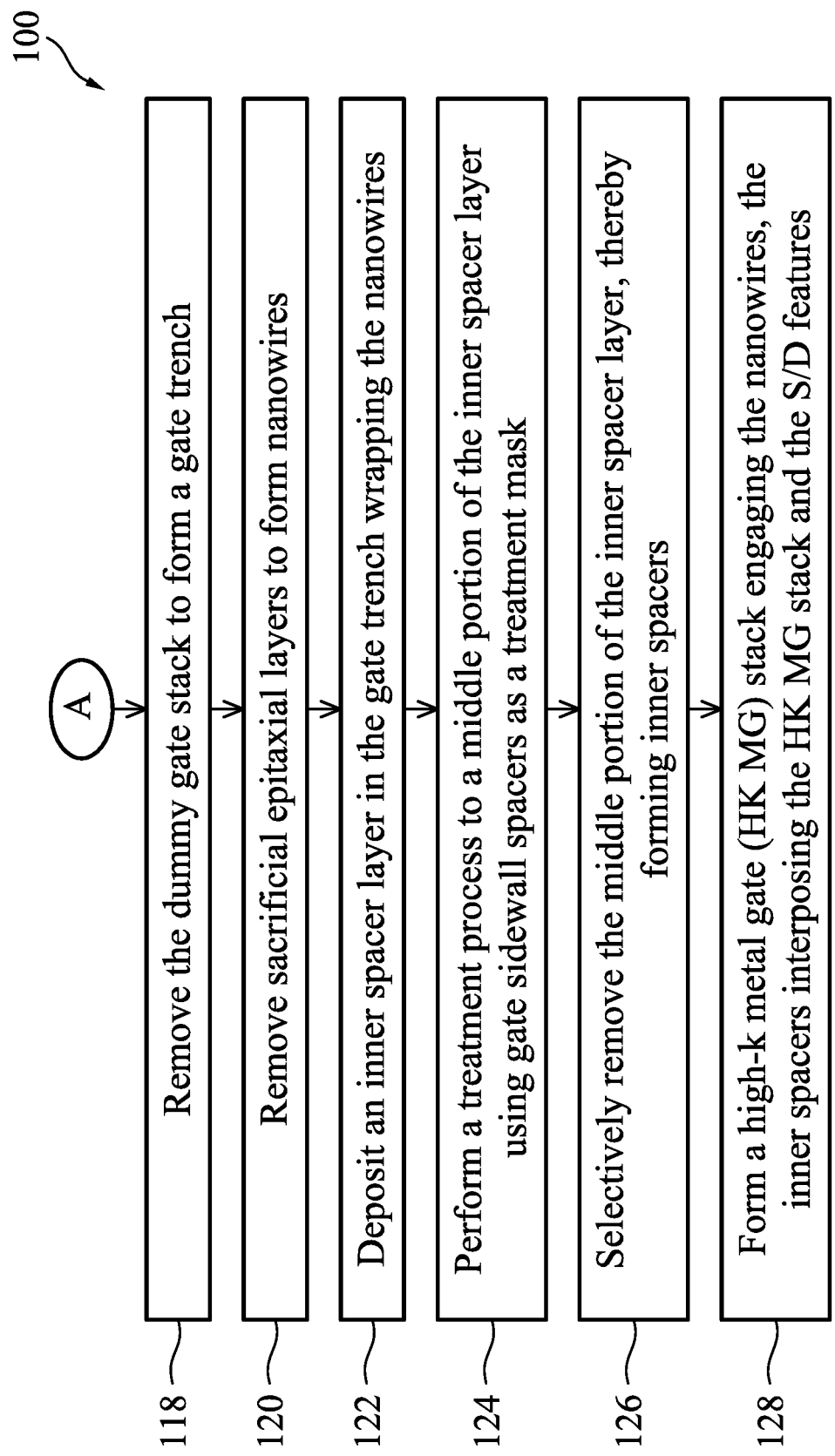

Illustrated in FIGS. 1A and 1B is a method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanowire," which as used herein includes channel regions of various geometries (e.g., cylindrical, bar-shaped) and various dimensions.

FIGS. 2, 3, 4, 5, 6, 7, 8A, 9A, 10A, 11A, 12A, and 13A are perspective views of an embodiment of a semiconductor device 200 according to various stages of the method 100 of FIGS. 1A and 1B. FIGS. 8B, 9B, 10B, 11B, 12B, and 13B are corresponding cross-sectional views of an embodiment of the semiconductor device 200 along a first cut (e.g., cut B-B in FIG. 8A), which is along a lengthwise direction of the channel and perpendicular to a top surface of the substrate; FIGS. 8C, 9C, 10C, 11C, 12C, and 13C are corresponding cross-sectional views of an embodiment of the semiconductor device 200 along a second cut (e.g., cut C-C in FIG. 8A), which is in the gate region and perpendicular to the lengthwise direction of the channel; FIGS. 8D, 9D, 10D, 11D, 12D, and 13D are corresponding cross-sectional views of an embodiment of a semiconductor device 200 along a third cut (e.g., cut D-D in FIG. 8A), which is along the lengthwise direction of the channel and parallel to the top surface of the substrate.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to FIGS. 2-13D, as with the remainder of the method and exemplary figures provided in this disclosure, are merely exemplary and are not intended to be limiting beyond what is specifically recited in the claims that follow.

Referring to FIG. 1A, the method 100 begins at step 102 where a substrate is provided. Referring to the example of FIG. 2, in an embodiment of step 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 may have isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features.

In an embodiment of the method 100, in step 102, an anti-punch through (APT) implant is performed. The APT implant may be performed in a region underlying the channel region of a device for example, to prevent punch-through or unwanted diffusion.

Returning to FIG. 1A, the method 100 then proceeds to step 104 where one or more epitaxial layers are grown on the substrate. With reference to the example of FIG. 2, in an embodiment of step 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layers 206 include SiGe and where the epitaxial layers 208 include Si, the Si oxidation rate of the epitaxial layers 208 is less than the SiGe oxidation rate of the epitaxial layers 206.

The epitaxial layers 208 or portions thereof may form nanosheet channel(s) of the multi-gate device 200. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 208 to define a channel or channels of a device is further discussed below.

Figure 2:
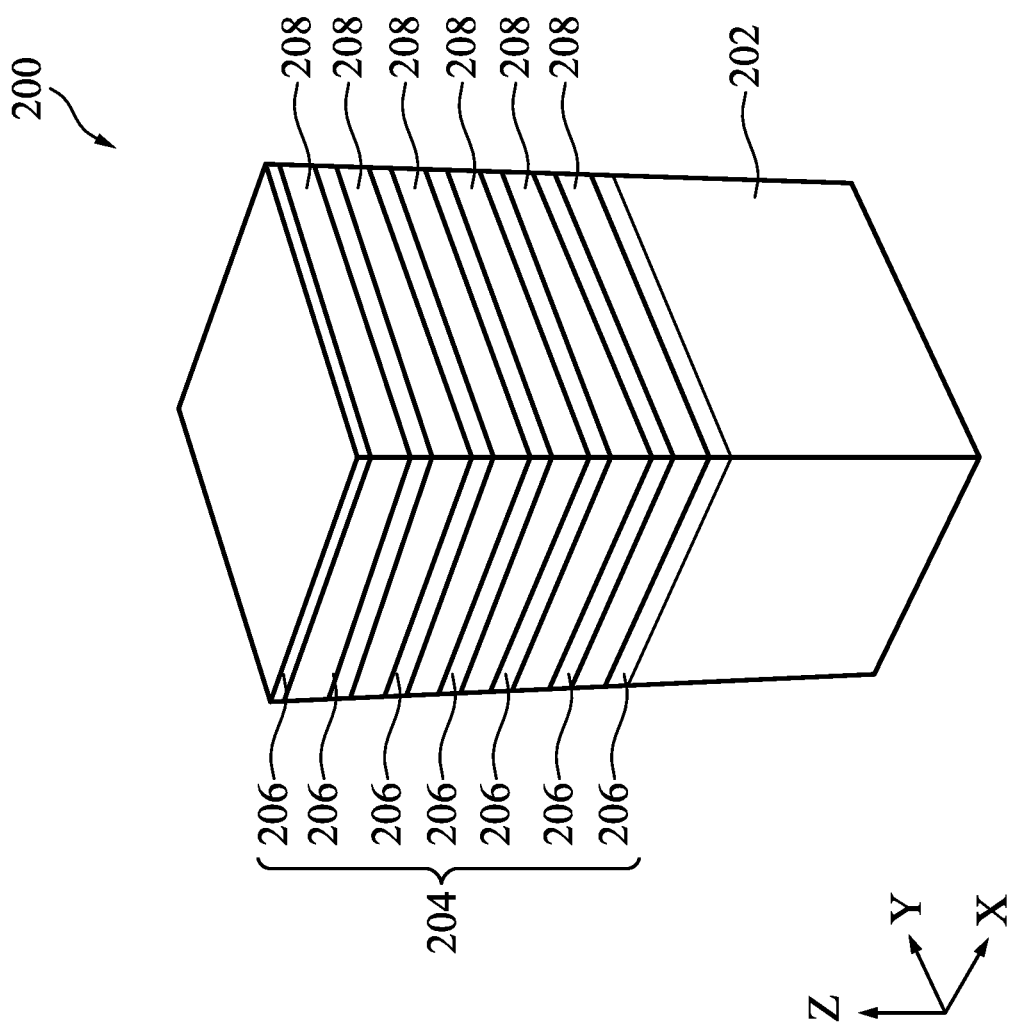
Figure 3:
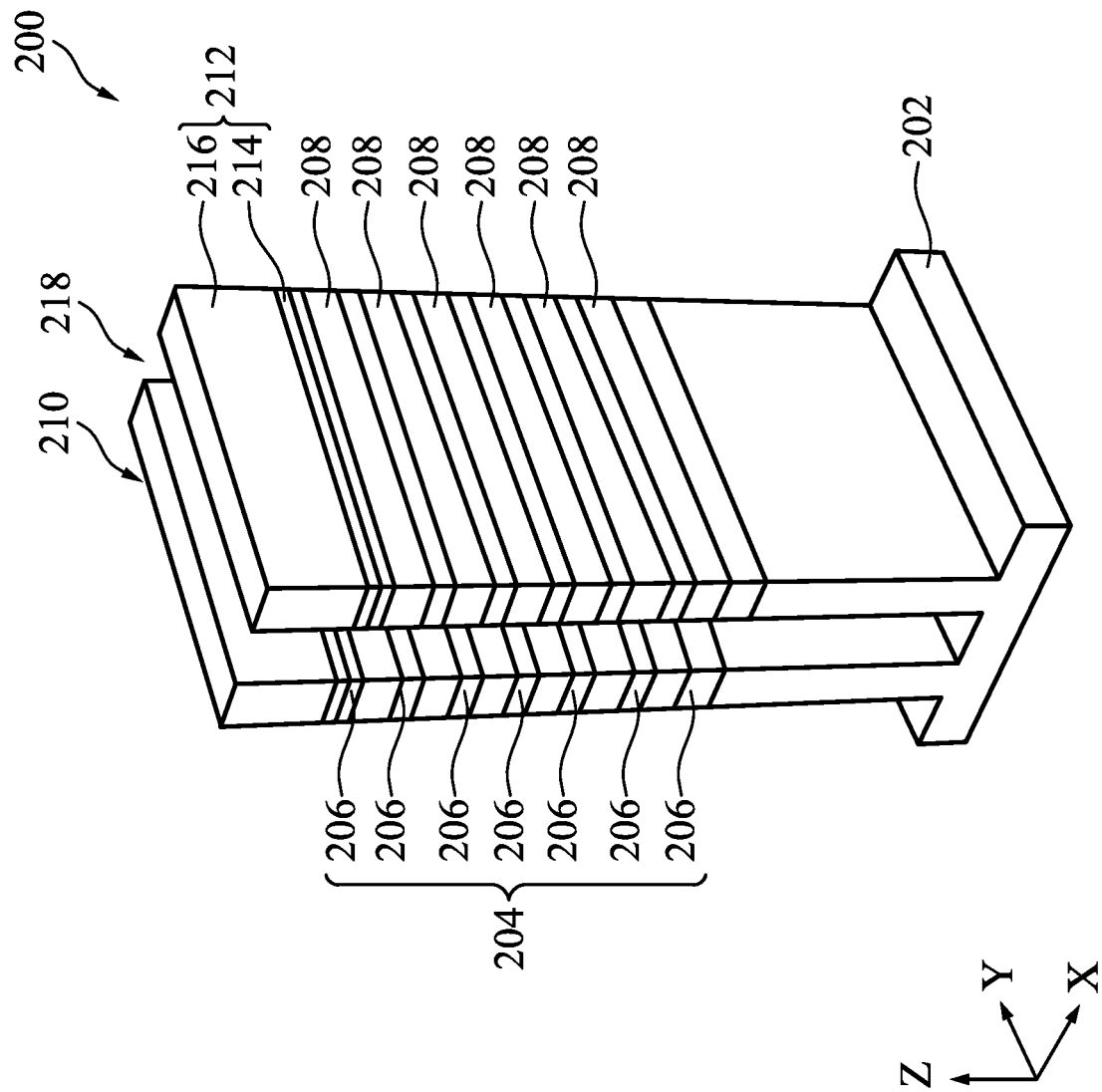

It is noted that seven (7) layers of the epitaxial layers 206 and six (6) layers of the epitaxial layers 208 are alternately arranged as illustrated in FIG. 2, which is for illustrative purposes only and not intended to be limiting beyond what is specifically recited in the claims. It can be appreciated that any number of epitaxial layers can be formed in the epitaxial stack 204; the number of layers depending on the desired number of channels regions for the device 200. In some embodiments, the number of epitaxial layers 208 is between 2 and 10.

In some embodiments, each epitaxial layer 206 has a thickness ranging from about 2 nanometers (nm) to about 6 nm. The epitaxial layers 206 may be substantially uniform in thickness. Yet in the illustrated embodiment, the top epitaxial layer 206 is thinner (e.g., half the thickness) than other epitaxial layers 206 thereunder. The top epitaxial layer 206 functions as a capping layer providing protections to other epitaxial layers in subsequent processes. In some embodiments, each epitaxial layer 208 has a thickness ranging from about 6 nm to about 12 nm. In some embodiments, the epitaxial layers 208 of the stack are substantially uniform in thickness. As described in more detail below, the epitaxial layers 208 may serve as channel region(s) for a subsequently-formed multi-gate device and the thickness is chosen based on device performance considerations. The epitaxial layers 206 in channel regions(s) may eventually be removed and serve to define a vertical distance between adjacent channel region(s) for a subsequently-formed multi-gate device and the thickness is chosen based on device performance considerations. Accordingly, the epitaxial layers 206 may also be referred to as sacrificial layers, and epitaxial layers 208 may also be referred to as channel layers.

By way of example, epitaxial growth of the layers of the stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 208 include the same material as the substrate 202. In some embodiments, the epitaxially grown layers 206 and 208 include a different material than the substrate 202. As stated above, in at least some examples, the epitaxial layers 206 include an epitaxially grown silicon germanium (SiGe) layer and the epitaxial layers 208 include an epitaxially grown silicon (Si) layer. Alternatively, in some embodiments, either of the epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206 and 208 may be chosen based on providing differing oxidation, etching selectivity properties. In some embodiments, the epitaxial layers 206 and 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

The method 100 then proceeds to step 106 where fin elements (referred to as fins) are formed by patterning. With reference to the example of FIG. 3, in an embodiment of block 106, a plurality of fins 210 extending from the substrate 202 are formed. In various embodiments, each of the fins 210 includes a substrate portion formed from the substrate 202 and portions of each of the epitaxial layers of the epitaxial stack including epitaxial layers 206 and 208. The fins 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 210 by etching initial epitaxial stack 204. The etching process can include dry etching, wet etching, reactive ion etching (RIE), and/or other suitable processes.

In the illustrated embodiment, a hard mask (HM) layer 212 is formed over the epitaxial stack 204 prior to patterning the fins 210. In some embodiments, the HM layer 212 includes an oxide layer 214 (e.g., a pad oxide layer that may include $SiO_2$) and a nitride layer 216 (e.g., a pad nitride layer that may include $Si_3N_4$) formed over the oxide layer 214. The oxide layer 214 may act as an adhesion layer between the epitaxial stack 204 and the nitride layer 216 and may act as an etch stop layer for etching the nitride layer 216. In some examples, the HM layer 212 includes thermally grown oxide, chemical vapor deposition (CVD)-deposited oxide, and/or atomic layer deposition (ALD)-deposited oxide. In some embodiments, the HM layer 212 includes a nitride layer deposited by CVD and/or other suitable technique.

The fins 210 may subsequently be fabricated using suitable processes including photolithography and etch processes. The photolithography process may include forming a photoresist layer (not shown) over the HM layer 212, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 218 in unprotected regions through the HM layer 212, through the epitaxial stack 204, and into the substrate 202, thereby leaving the plurality of extending fins 210. The trenches 218 may be etched using a dry etch (e.g., reactive ion etching), a wet etch, and/or combination thereof.

Numerous other embodiments of methods to form the fins on the substrate may also be used including, for example, defining the fin region (e.g., by mask or isolation regions) and epitaxially growing the epitaxial stack 204 in the form of the fin 210. In some embodiments, forming the fins 210 may include a trim process to decrease the width of the fins 210. The trim process may include wet and/or dry etching processes.

Figure 4:
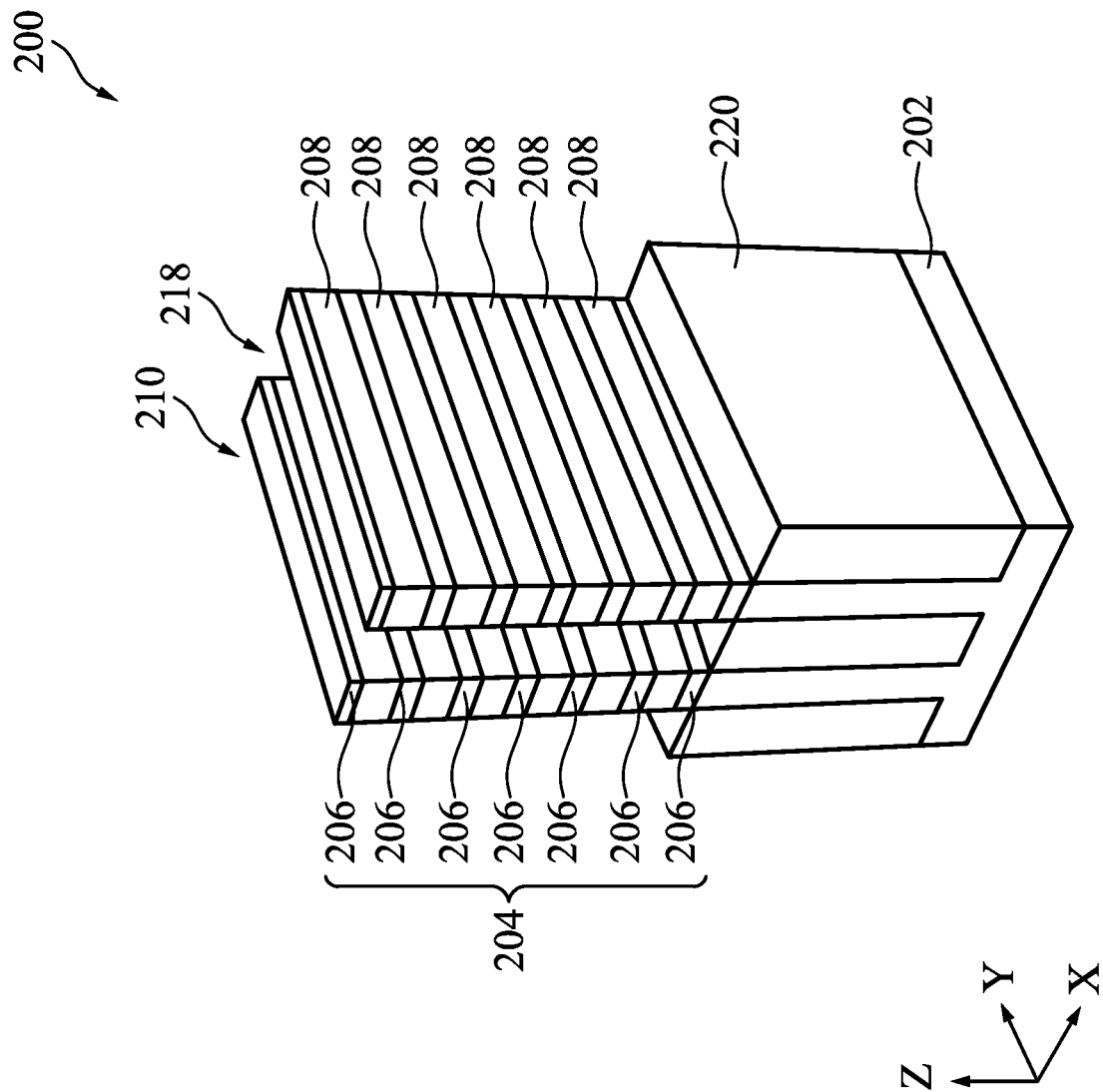

Referring to FIGS. 1A and 4, method 100 proceeds to step 108 by forming shallow trench isolation (STI) features 220 interposing the fins 210. By way of example, in some embodiments, a dielectric layer is first deposited over the substrate 202, filling the trenches 218 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 220) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 212 (FIG. 3) functions as a CMP stop layer. The STI features 220 interposing the fins 210 are recessed. Referring to the example of FIG. 4, the STI features 220 are recessed providing the fins 210 extending above the STI features 220. In some embodiments, the recessing process may include a dry etching process, a wet etching process, and/or a combination thereof. The HM layer 212 may also be removed before, during, and/or after the recessing of the STI features 220. The HM layer 212 may be removed, for example, by a wet etching process using $H_3PO_4$ or other suitable etchants. In some embodiments, the HM layer 212 is removed by the same etchant used to recess the STI features 220. In some embodiments, a recessing depth is controlled (e.g., by controlling an etching time) so as to result in a desired height of the exposed upper portion of the fins 210. In the illustrated embodiment, the desired height exposes each of the layers of the epitaxial stack 204.

The method 100 then proceeds to step 110 where sacrificial layers/features are formed and in particular, a dummy gate structure. While the present discussion is directed to a replacement gate process whereby a dummy gate structure is formed and subsequently replaced, other configurations may be possible.

Figure 5:
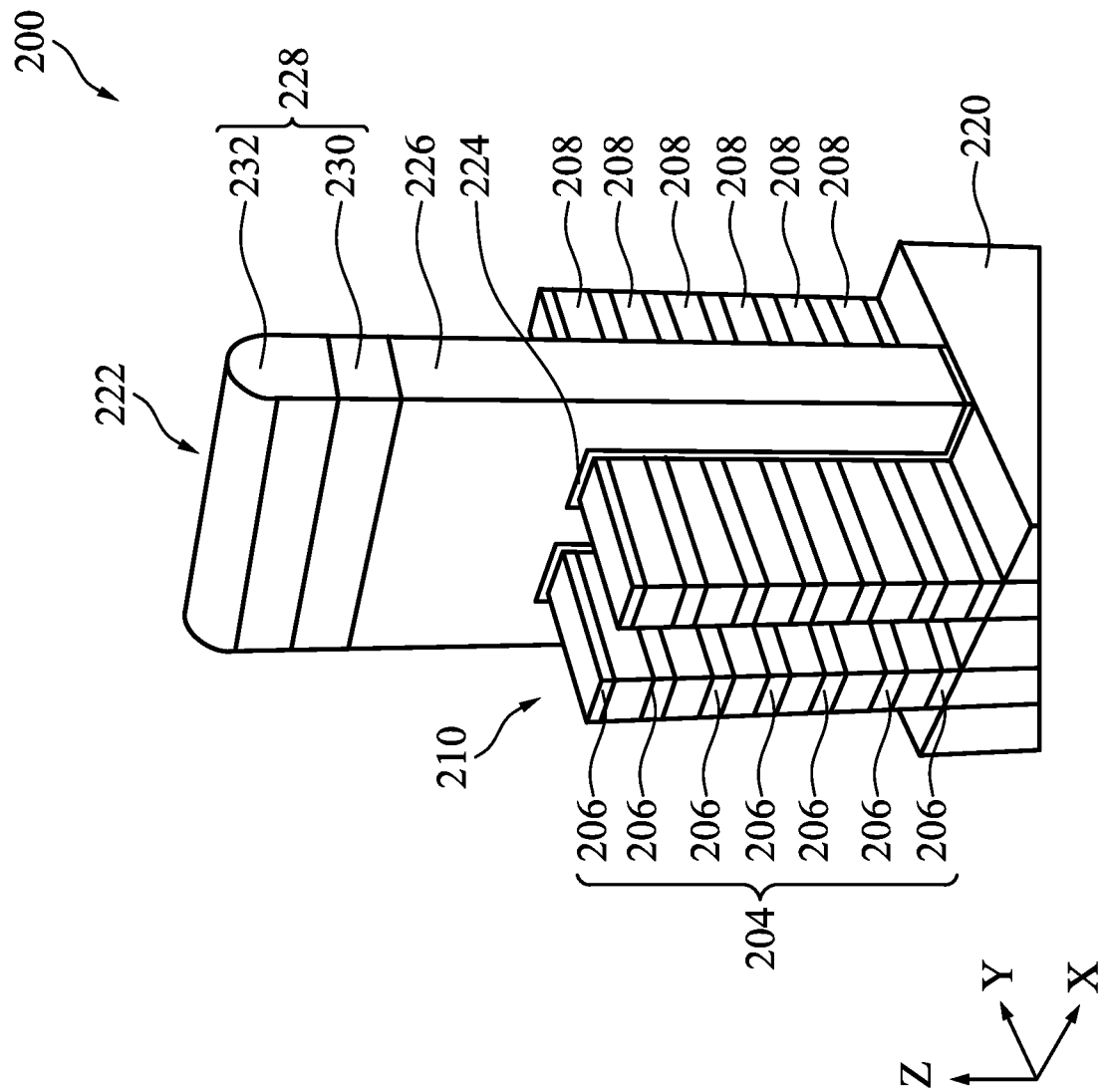

With reference to FIG. 5, a gate stack 222 is formed. In an embodiment, the gate stack 222 is a dummy (sacrificial) gate stack that is subsequently removed (with reference to step 118). Thus, in some embodiments using a gate-last process, the gate stack 222 is a dummy gate stack and will be replaced by the final gate stack at a subsequent processing stage of the device 200. In particular, the dummy gate stack 222 may be replaced at a later processing stage by a high-K dielectric layer (HK) and metal gate electrode (MG) as discussed below. In some embodiments, the dummy gate stack 222 is formed over the substrate 202 and is at least partially disposed over the fins 210. The portion of the fins 210 underlying the dummy gate stack 222 may be referred to as the channel region. The dummy gate stack 222 may also define a source/drain (S/D) region of the fins 210, for example, the regions of the fin 210 adjacent and on opposing sides of the channel region.

In the illustrated embodiment, step 110 first forms a dummy dielectric layer 224 over the fins 210. In some embodiments, the dummy dielectric layer 224 may include $SiO_2$, silicon nitride, a high-K dielectric material and/or other suitable material. In various examples, the dummy dielectric layer 224 may be deposited by a CVD process, a subatmospheric CVD (SACVD) process, a flowable CVD process, an ALD process, a PVD process, or other suitable process. By way of example, the dummy dielectric layer 224 may be used to prevent damages to the fins 210 by subsequent processes (e.g., subsequent formation of the dummy gate stack). Subsequently, step 110 forms other portions of the dummy gate stack 222, including a dummy electrode layer 226 and a hard mask 228 which may include multiple layers 230 and 232 (e.g., an oxide layer 230 and a nitride layer 232). In some embodiments, the dummy gate stack 222 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the electrode layer 226 may include polycrystalline silicon (polysilicon). In some embodiments, the hard mask 228 includes an oxide layer 230 such as a pad oxide layer that may include $SiO_2$. In some embodiments, hard mask 228 includes the nitride layer 232 such as a pad nitride layer that may include $Si_3N_4$, silicon oxynitride and/or silicon carbide.

Still referring to FIG. 5, in some embodiments, after formation of the dummy gate stack 222, the dummy dielectric layer 224 is removed from the S/D regions of the fins 210. The etch process may include a wet etch, a dry etch, and/or a combination thereof. The etch process is chosen to selectively etch the dummy dielectric layer 224 without substantially etching the fins 210, the hard mask 228, and the dummy electrode layer 226.

Figure 6:
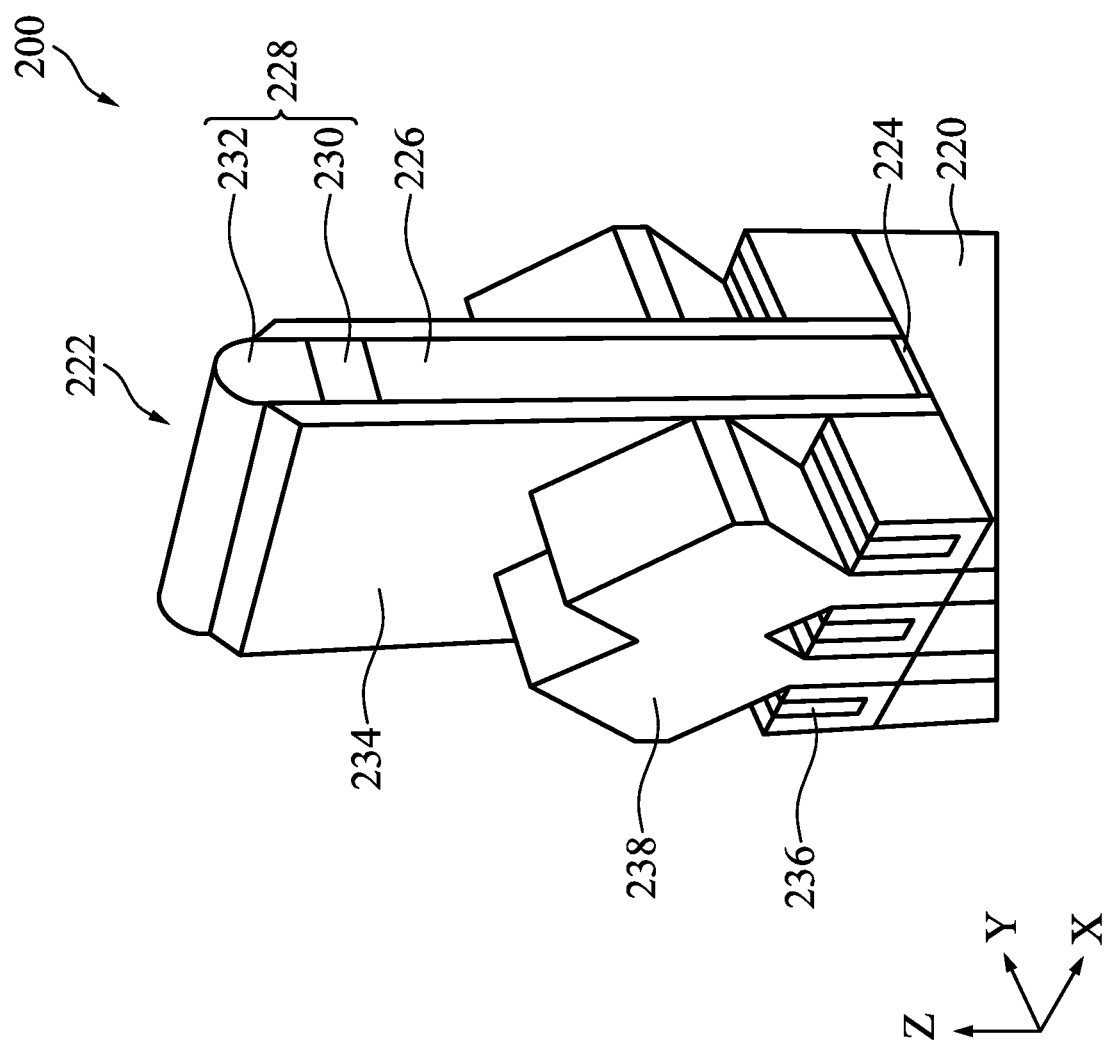

Referring to FIGS. 1A and 6, the method 100 then proceeds to step 112 where a spacer material layer is deposited on the substrate. The spacer material layer may be a conformal layer that is subsequently etched back to form sidewall spacers. In the illustrated embodiment, a spacer material layer 234 is disposed conformally on top and sidewalls of the dummy gate stack 222. The term "conformally" may be used herein for ease of description upon a layer having substantial same thickness over various regions. The spacer material layer 234 may include a dielectric material such as silicon oxide, silicon nitride, silicon carbide, silicon oxynitride, SiCN films, silicon oxycarbide, SiOCN films, and/or combinations thereof. In some embodiments, the spacer material layer 234 includes multiple layers, such as main spacer walls, liner layers, and the like. By way of example, the spacer material layer 234 may be formed by depositing a dielectric material over the gate stack 304 using processes such as, CVD process, a subatmospheric CVD (SACVD) process, a flowable CVD process, an ALD process, a PVD process, or other suitable process. It is noted that in the illustrated embodiment the spacer material layer 234 also conformally covers sidewalls of the fins 210 in the exposed S/D regions, for example, in an ALD process, and partially fills the space between adjacent fins 210. If there are gaps remained between adjacent fins 210 after filling the spacer material layer 234, the block 112 may further deposit other dielectric material, for example, the dielectric material layer 236, to fill up the gaps between adjacent fins 210 in the S/D regions. The dielectric material layer 236 may include silicon oxide, silicon nitride, silicon carbide, silicon oxynitride, SiCN films, silicon oxycarbide, SiOCN films, and/or combinations thereof. In various embodiments, the spacer material layer 234 and dielectric material layer 236 include different material compositions, such as the spacer material layer 234 includes silicon nitride and the dielectric material layer 236 includes silicon carbide.

The step 112 may subsequently perform an anisotropic etching process to expose portions of the fins 210 adjacent to and not covered by the dummy gate stack 222 (e.g., in source/drain regions). Portions of the spacer material layer directly above the dummy gate stack 222 may be completely removed by this anisotropic etching process. Portions of the spacer material layer on sidewalls of the dummy gate stack 222 may remain, forming sidewall spacers, which is denoted as the sidewall spacers 234, for the sake of simplicity.

Still referring to FIGS. 1A and 6, the method 100 then proceeds to step 114 where epitaxial S/D features 238 are formed on the substrate. The epi features 238 may be formed by performing an epitaxial growth process that provides an epitaxial material on the fin 210 in the source/drain region. During the epitaxial growth process, the dummy gates 222 and sidewall spacers 234 limit the epitaxial S/D features 238 to the S/D regions. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of the substrate 102. In some embodiments, the epitaxial S/D features 238 grown on adjacent semiconductor fins 210 are spaced from each other. In some embodiments, epitaxial S/D features 238 are grown in a way that they are merged, such as illustrated in FIG. 6. In the illustrated embodiment, the height of the fins 210 in the source/drain regions is also recessed before expitaxially growing the epitaxial S/D features 238. As an example, the fins 210 in the source/drain regions may become equal to or lower than the top surface of the STI features 220, and epitaxial S/D features 238 extend upwardly from the top surfaces of the fins 210 to a height above the STI features 220.

In various embodiments, the epitaxial S/D features 238 may include Ge, Si, GaAs, AlGaAs, SiGe, GaAsP, SiP, or other suitable material. The epitaxial S/D features 238 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial S/D features 238 are not in-situ doped, an implantation process (i.e., a junction implant process) is performed to dope the epitaxial S/D features 238. In an exemplary embodiment, the epitaxial S/D features 238 in an NMOS device include SiP, while those in a PMOS device include GeSnB and/or SiGeSnB. Furthermore, silicidation or germano-silicidation may be formed on the epitaxial S/D features 238. For example, silicidation, such as nickel silicide, may be formed by depositing a metal layer over the epitaxial S/D features 238, annealing the metal layer such that the metal layer reacts with silicon in the epitaxial S/D features 238 to form the metal silicidation, and thereafter removing the non-reacted metal layer.

Figure 7:
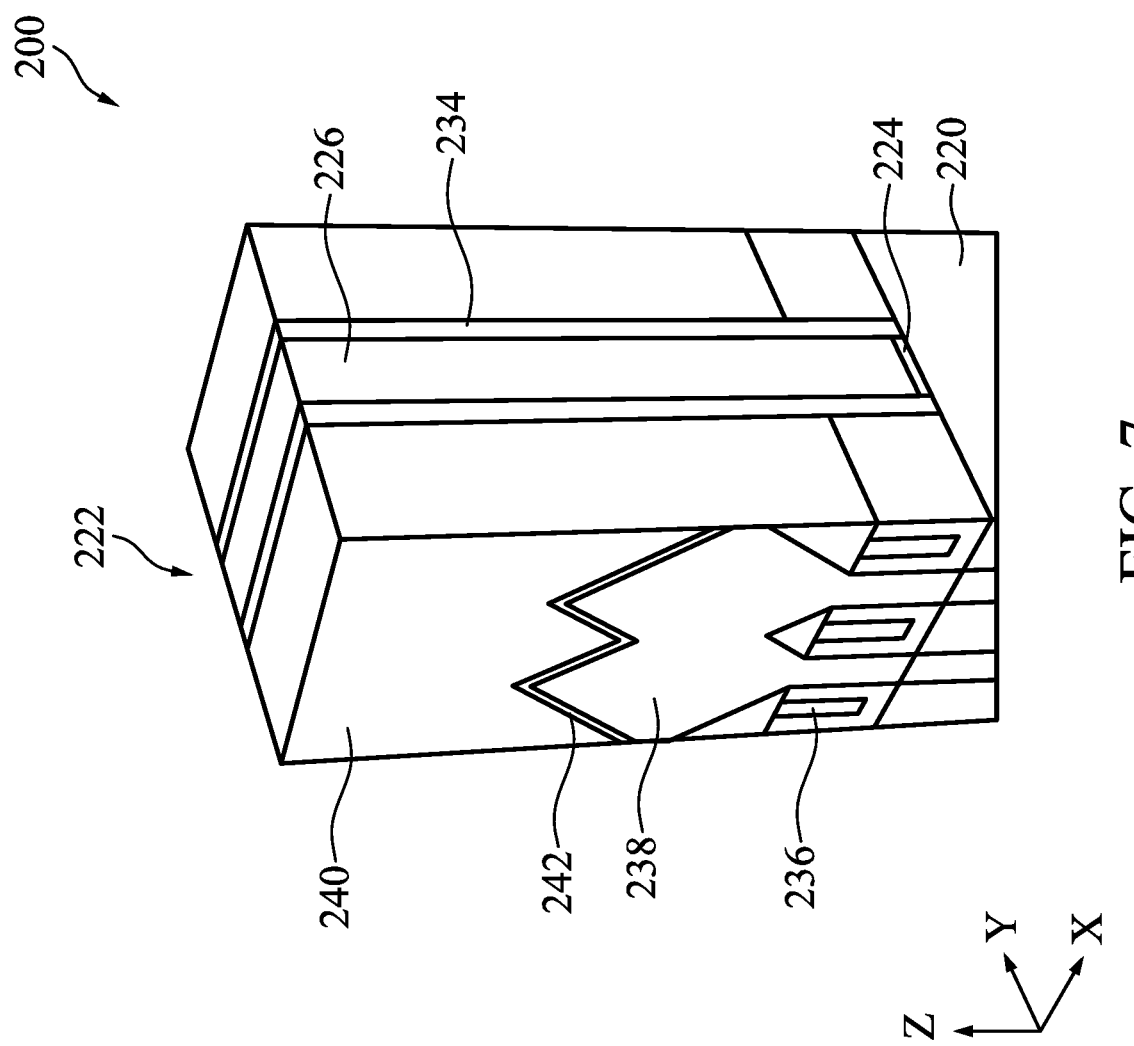

Referring to FIGS. 1A and 7, the method 100 then proceeds to step 116 where an inter-layer dielectric (ILD) layer 240 is formed on the substrate. In some embodiments, a contact etch stop layer (CESL) 242 is also formed prior to forming the ILD layer 240. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 240 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 240 may be deposited by a PECVD process or other suitable deposition technique. In some embodiments, after formation of the ILD layer 240, the semiconductor device 200 may be subject to a high thermal budget process to anneal the ILD layer.

In some examples, after depositing the ILD layer, a planarization process may be performed to remove excessive dielectric materials. For example, a planarization process includes a chemical mechanical planarization (CMP) process which removes portions of the ILD layer 240 (and CESL layer, if present) overlying the gate stack 222 and planarizes a top surface of the semiconductor device 200. In some embodiments, the CMP process also removes hard mask 228 (FIG. 6) and exposes the gate electrode layer 226.

The method 100 then proceeds to step 118 (FIG. 1B) by removing the dummy gate stack 222 to form a gate trench 246 in the channel region. The resultant structure 200 is shown in FIGS. 8A-8D, wherein FIG. 8A is a perspective view of the device 200, FIG. 8B refers to a cross-sectional view taken along a lengthwise direction of the channel (e.g., along the B-B line), FIG. 8C refers to a cross-sectional view taken in the channel region and perpendicular to the lengthwise direction of the channel (e.g., along the C-C line), and FIG. 8D refers to a cross-sectional view taken though one of the epitaxial layer 206 and parallel to a top view (e.g., along the D-D line). A final gate structure (e.g., including a high-K dielectric layer and metal gate electrode) may be subsequently formed in the gate trench 246, as will be described below. The step 118 may include one or more etching processes that are selective to the material in the dummy gate stack 222. For example, the removal of the dummy gate stack 222 may be performed using a selective etch process such as a selective wet etch, a selective dry etch, or a combination thereof. The epitaxial layers 206 and 208 of the fin 210 are exposed in the gate trench 246. The opposing sidewalls $S_{234}$ of the sidewall spacers 234 are also exposed in the gate trench 246.

The method 100 then proceeds to step 120 (FIG. 1B) by removing the epitaxial layers 206 from the fin 210 in the gate trench 246. The resultant structure 200 is shown in FIGS. 9A-9D, which are perspective view and cross-sectional views along the B-B, C-C, D-D lines of the device 200, respectively. In an embodiment, the epitaxial layers 206 are removed by a selective wet etching process. In an embodiment, the epitaxial layers 206 are SiGe and the second epitaxial layers 208 are silicon allowing for the selective removal of the epitaxial layers 206. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. It is noted that as illustrated in the accompanying figures the second epitaxial layers 208 (e.g., nanowires) have a substantially rounded shape (e.g., cylindrical) due to removal process of the epitaxial layers 206. It is noted that during the interim processing stage of step 120, gaps 248 are provided between the adjacent nanowires in the channel region (e.g., gaps 248 between epitaxial layers 208). The gaps 248 may be filled with the ambient environment conditions (e.g., air, nitrogen).

The method 100 then proceeds to step 122 (FIG. 1B) by depositing a dielectric material layer 252 in the gate trench 246. As will be shown in further details below, the dielectric material layer 252 is etched and formed into inner spacer features. Therefore, the dielectric material layer 252 is also referred to as the inner spacer material layer 252. The resultant structure 200 is shown in FIGS. 10A-10D, which are perspective view and cross-sectional views along the B-B, C-C, D-D lines of the device 200, respectively. The inner spacer material layer 252 is deposited on opposing sidewalls $S_{234}$ of the sidewall spacers 234 and over the substrate 202. The inner spacer material layer 252 also wraps over each of the epitaxial layers 208 in the channel region. The inner-spacer layer 840 may fill the gaps 248 provided by the removal of the epitaxial layers 206 described in step 120 above. The inner spacer material layer 252 may include a dielectric material, such as SiN, SiOC, SiOCN, SiCN, $SiO_2$, and/or other suitable material. In various embodiments, the sidewall spacers 234 and the inner spacer material layer 252 include different material compositions, such as the sidewall spacer layer 234 includes SiN and the inner spacer material layer 252 includes SiOC. It is noted that in the illustrated embodiment the inner spacer material layer 252 is conformally deposited on sidewalls $S_{234}$ of the sidewall spacers 234 and on each of the nanowires of the fins 210 in the channel region, for example, by an ALD process.

The method 100 then proceeds to step 124 (FIG. 1B) where a treatment process 260 is performed. In various embodiments, the treatment process 260 is through the gate trench 246, using the sidewall spacers 234 as a treatment mask. The resultant structure 200 is shown in FIGS. 11A-11D, which are perspective view and cross-sectional views along the B-B, C-C, D-D lines of the device 200, respectively. A middle portion of the inner spacer material layer 252 between two opposing sidewalls $S_{234}$ of the sidewall spacers 234 (denoted as portion 252a) receives the treatment process 260, resulting in a material composition change, such that an etch selectivity exhibits compared to other parts of the inner spacer material layer 252 (denoted as portion 252b). In some embodiments, the treatment process 260 includes an oxygen ($O_2$) ashing, such as a plasma oxygen ashing. During the plasma oxygen ashing, the oxygen radicals react with components, for example, C, H, S, and N, in the middle portion 252a to afford their respective oxides which are volatile. In a specific example, the inner spacer material layer 252 includes SiCN. During the plasma oxygen ashing, carbon and nitrogen are released from the middle portion 252a in the form of carbon oxide and nitrogen oxide, while silicon is oxidized and remains in the middle portion 252a in the form of silicon oxide. As a comparison, in portions 252b, which is covered by the sidewall spacers 234 from receiving the treatment process 260, SiCN substantially remains. Therefore, etch selectivity exists between portions 252a and 252b. As will be explained in further details below, portion 252a will subsequently be removed in a selective etching process, and portion 252b will remain as inner spacers. In some embodiments, the plasma oxygen ashing includes a gaseous combination of $C_2F_6$ and $O_2$ in a first ashing step and then follow with a pure $O_2$ in a second ashing step. The gaseous combination of $C_2F_6$ and $O_2$ is more effective than a pure $O_2$ to remove ions from a dielectric material layer if there is any. Similarly, the plasma oxygen ashing may include a gaseous combination of $CF_4$ and $O_2$ in a first plasma ash step and pure $O_2$ plasma is then used in a second step to complete the ashing process.

In some embodiments, the treatment process 260 includes a nitrogen treatment, such as a nitrogen plasma treatment. During the nitrogen plasma treatment, oxygen in the middle portion 252a is released and oxide component is converted to nitride component. In a specific example, the inner spacer material layer 252 includes silicon oxide, which releases oxygen and is converted to silicon nitride after the nitrogen plasma treatment. The nitrogen plasma treatment may use a pure nitrogen plasma source or a $N_2$ and $O_2$ mixture source with a volumetric ratio of $N_2$ to $O_2$ from about 60:1 to about 90:1. The nitrogen plasma treatment includes exposure to the plasma source at a vacuum of between about 4 to 8 Torr at a temperature of between about 350° C. to about 450° C., at a power of between about 180 to about 220 watts for about 10 to 50 seconds.

In some embodiments, the treatment process 260 includes an annealing process. The annealing process may weaken bonds within molecular structure or even create dangling bonds, which facilitate the release of components such as C, N, S, H, and O. In at least some embodiments, the device 200 is exposed to a temperature range of about 500° C. to about 800° C., and for a time from about 0.5 to about 2 hours. If the annealing process is below 500° C., the release of components may be insufficient in some examples. If the annealing process is above 800° C., the device performance deviation may increase due to dopant diffusion in some examples. The annealing process may further include a water vapor or steam as an oxidant, at a pressure of about 1 Atmosphere. In a specific example, the inner spacer material layer 252 includes SiOC, where the annealing process weakens the bonding of C and further releases C in form of carbon oxide. After the annealing process, the middle portion 252a includes mainly silicon oxide, while SiOC in portion 252b substantially remains.

Referring to FIG. 11B, a region 264 along the cut of B-B line, which comprises an interface between the portions 252a and 252b, is enlarged for details. The portion 252a may expand to a region directly under the sidewall spacer 234, such as due to diffusion during the treatment process 260. Therefore, the interface between the portions 252a and 252b along the cut of B-B line may have a curvature shape. The portion 252a may expand into portion 252b for a distance $d_1$ of about 0.5 nm to about 5 nm in some embodiments. Referring to FIG. 11D, a region 266 along the cut of D-D line, which comprises the interface between the portions 252a and 252b, is enlarged for details. Similarly, the portion 252a may expand beyond sidewall surface $S_{234}$ of the sidewall spacer 234 along the Y-direction for a distance $d_2$ of about 0.5 nm to about 5 nm in some embodiments, such as due to diffusion. The inventors of the present disclosure have observed that from a top view the diffusion is easier to occur in areas closer to the sidewall spacer 234. Therefore, the interface between the portions 252a and 252b along the cut of D-D line may have two curvature segments intersecting at an apex approximately at middle of a width of the portion 252b (width along the X-direction). In some embodiments, the distance $d_1$ is equal to the distance $d_2$.

The method 100 then proceeds to step 126 (FIG. 1B) where the middle portion 252a of the inner spacer material layer 252 is selectively removed. The resultant structure 200 is shown in FIGS. 12A-12D, which are perspective view and cross-sectional views along the B-B, C-C, D-D lines of the device 200, respectively. In various embodiments the middle portion 252a is removed in an etching process that is tuned to be selective to the middle portion 252a and does not substantially etch the portion 252b. The etching process may include wet etching, dry etching, reactive ion etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF), potassium hydroxide (KOH) solution, ammonia, a solution containing hydrofluoric acid (HF), nitric acid ($HNO_3$), and/or acetic acid ($CH_3COOH$), or other suitable wet etchants. In a specific example, the middle portion 252a includes nitride and the etching process is a wet etching process using $H_3PO_4$ or other suitable etchants. After removing the middle portion 252a, gaps 248 appear between the adjacent nanowires (i.e., epitaxial layers 208) in the channel region. Along the Y direction, one end of the portion 252b abuts the epitaxial S/D features 238, and another end of the portion 252b faces the gate trench 246 and gaps 248. As will be shown in further details below, a high-K metal gate (HK MG) will be form in the gate trench 246, abutting the portion 252b. The portion 252b therefore provides isolation between the HK MG and the epitaxial S/D features 238. Thus, the portion 252b is also referred to as the inner spacers 252b.

The enlarged region 264 is illustrated in FIG. 12B. After removing the middle portion 252a, the inner spacers 252b has a concave surface facing the gate trench 246 and the gaps 248 along the cut of B-B line. The concave surface extends inwardly towards the epitaxial S/D features 238. In some embodiments, the concave surface has a depth $d_1$ of about 0.5 nm to about 5 nm. Similarly, the enlarged region 266 is illustrated in FIG. 12D. After removing the middle portion 252a, the inner spacers 252b has a convex surface facing the gate trench 246 and the gaps 248 along the cut of D-D line. The convex surface comprises two curvature segments intersecting at an apex 268, which is approximately at middle of a width of the portion 252b (width along the X-direction). The apex 268 extends outwardly towards the gate trench 246 and the gaps 248. The two curvature segments on both sides of the apex 268 bend inwardly away from the gate trench 246 and the gaps 248. In some embodiments, the convex surface has a height $d_2$ of about 0.5 nm to about 5 nm. In some embodiments, the distance $d_1$ is equal to the distance $d_2$. A thickness $d_3$ of the portion 252b is defined as a distance from the apex 268 to the epitaxial S/D features 238 along the Y-direction. In some embodiments, the thickness $d_3$ is substantially the same as a thickness of the sidewall spacers 234. The thickness $d_3$ may be between approximately 5 nm and approximately 12 nm.

Since dimensions of the inner spacers 252b is mainly defined by the sidewall spacers 234, which covers the inner spacers 252b from receiving the prior treatment 260, each of the inner spacers 252b has substantially the same dimensions from the top layers to the bottom layers, due to the conformal thickness of the sidewall spacers 234. Compared with conventional etching process in forming inner spacers 252b, the inner spacers 252b at lower layers (e.g., closer to the substrate 202) may become larger than those in upper layers, such as due to loading effects in an etching process. The inner spacers 252b with substantially same dimensions in the illustrated embodiment improves uniformity of the device, such as uniform gate lengths for the HK MG to be formed in the gate trench 246 in subsequent steps.

The method 100 then proceeds to step 128 (FIG. 1B) where a gate structure is formed. The resultant structure is shown in FIGS. 13A-13D, which are perspective view and cross-sectional views along the B-B, C-C, D-D lines of the device 200, respectively. The gate structure may be the gate of a multi-gate transistor. The gate structure may be a high-K/metal gate (HK MG) stack, however other compositions are possible. In some embodiments, the gate structure forms the gate associated with the multi-channels provided by the plurality of nanowires (now having gaps therebetween) in the channel region.

In an embodiment of step 128, a HK MG stack 280 is formed within the trench of the device 200 provided by the removal of the middle portions (i.e., middle portions 252a) of inner spacer material layer 252 and/or release of nanowires 208, described above with reference to prior step 126. In various embodiments, the HK MG stack 280 includes an interfacial layer 282, a high-K gate dielectric layer 284 formed over the interfacial layer, and/or a gate electrode layer 286 formed over the high-K gate dielectric layer 284. High-K gate dielectrics, as used and described herein, include dielectric materials having a high dielectric constant, for example, greater than that of thermal silicon oxide (~3.9). The gate electrode layer used within HK MG stack may include a metal, metal alloy, or metal silicide. Additionally, the formation of the HK MG stack may include depositions to form various gate materials, one or more liner layers, and one or more CMP processes to remove excessive gate materials and thereby planarize a top surface of the semiconductor device 200. Interposing the HK MG stack 280 and the epitaxial S/D features 238 is the inner spacers 252b, providing isolation. Due to the uniformity of dimensions of the inner spacers 252b from top to bottom of the device 200, the uniformity of the gate length is herein improved.

In some embodiments, the interfacial layer 282 of the HK MG stack 280 may include a dielectric material such as silicon oxide ($SiO_2$), HfSiO, or silicon oxynitride (SiON). The interfacial layer 282 may be formed by chemical oxidation, thermal oxidation, atomic layer deposition (ALD), chemical vapor deposition (CVD), and/or other suitable method. The high-K gate dielectric layer 284 of the high-K/metal gate stack 280 may include a high-K dielectric layer 284 such as hafnium oxide ($HfO_2$). Alternatively, the high-K gate dielectric layer 284 of the gate stack 1002 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 284 may be formed by ALD, physical vapor deposition (PVD), CVD, oxidation, and/or other suitable methods. As illustrated in FIG. 13D, in some embodiments, the high-K gate dielectric layer 284 is deposited conformally on sidewalls of the inner spacer 252b and sidewall spacers 234. Accordingly, the high-k dielectric layer 284 may also have a convex surface with an apex extending outwardly towards the gate electrode layer 286.

The gate electrode layer 286 of the HK MG stack 280 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 286 of HK MG stack 280 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer 284 of the HK MG stack 280 may be formed by ALD, PVD, CVD, e-beam evaporation, or other suitable process. Further, the gate electrode layer 284 may be formed separately for N-FET and P-FET transistors which may use different metal layers (e.g., for providing an N-type or P-type work function). In various embodiments, a CMP process may be performed to remove excessive metal from the gate electrode layer 284 of the HK MG stack 280, and thereby provide a substantially planar top surface of the HK MG stack 280. The HK MG stack 280 includes portions that interpose each of the epitaxial layers (nanowires) 208, which form channels of the multi-gate device 200.

The semiconductor device 200 may undergo further processing to form various features and regions known in the art. For example, subsequent processing may form contact openings, contact metal, as well as various contacts/vias/lines and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 14A:
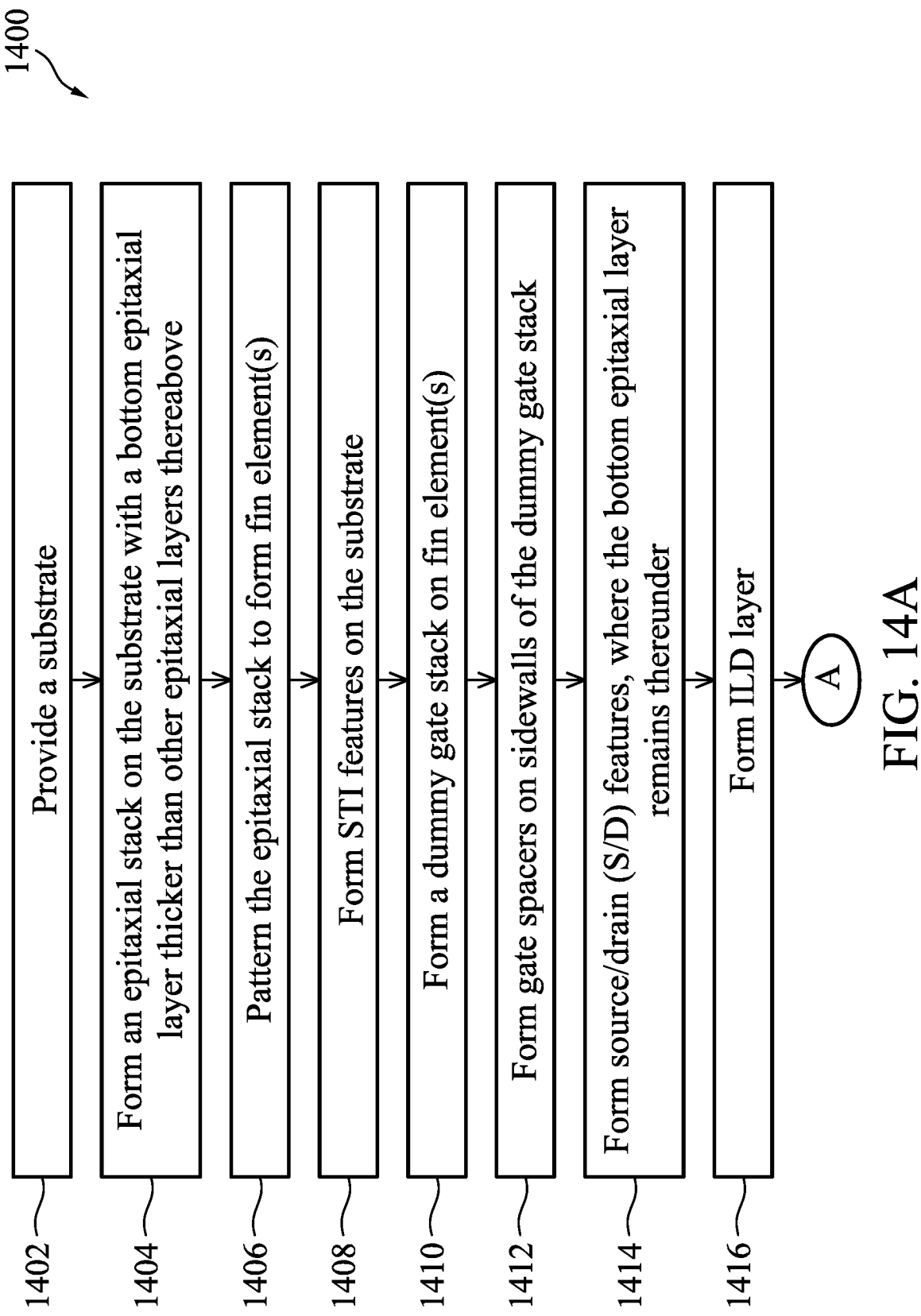
FIGS. 14A and 14B show a flow chart of another method for forming a multi-gate device including inner-spacer features, according to one or more aspects of the present disclosure.
Figure 14B:
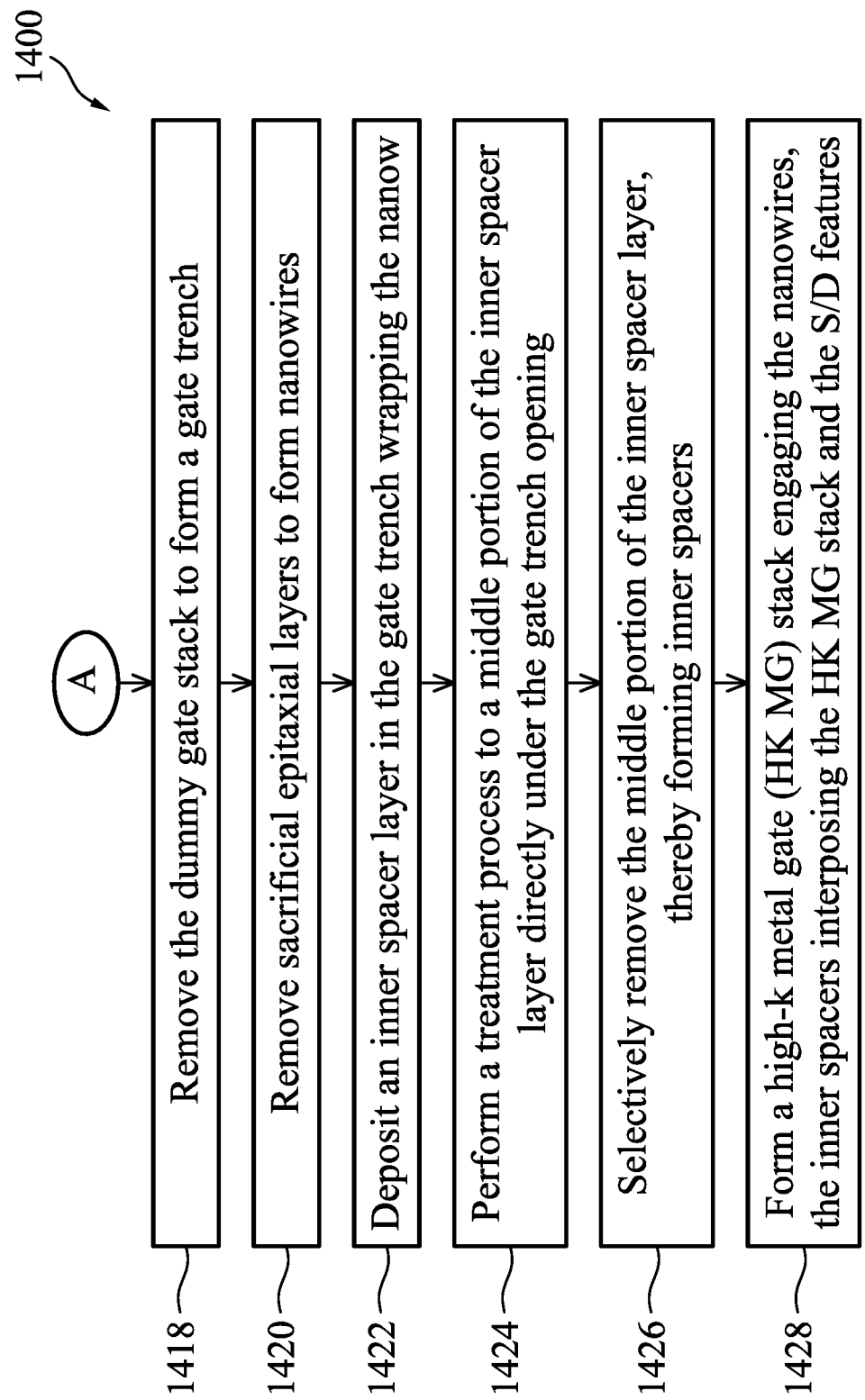

Referring now to FIGS. 14A and 14B, illustrated is a method 1400 of fabricating a multi-gate device. The method 1400 is substantially similar to the method 100 in many aspects and the description of the method 100 above also applies to the method 1400. An embodiment of the method 1400 additionally starts with a bottom sacrificial layer thicker than other sacrificial layers thereabove, which will be replaced by an inner sidewall material layer to provide better isolation between a gate stack and S/D features, as well as between substrate and S/D features, as will be discussed in further detail below.

FIGS. 15, 16, 17, 18, 19, 20, 21A, 22A, 23A, 24A, 25A, and 26A are perspective views of an embodiment of a semiconductor device 201 according to various stages of the method 1400 of FIGS. 14A and 14B. FIGS. 21B, 22B, 23B, 24B, 25B, and 26B are corresponding cross-sectional views of an embodiment of the semiconductor device 201 along a first cut (e.g., cut B-B in FIG. 21A), which is along a lengthwise direction of the channel and perpendicular to a top surface of the substrate; FIGS. 21C, 22C, 23C, 24C, 25C, and 26C are corresponding cross-sectional views of an embodiment of the semiconductor device 201 along a second cut (e.g., cut C-C in FIG. 21A), which is in the gate region and perpendicular to the lengthwise direction of the channel; FIGS. 21D, 22D, 23D, 24D, 25D, and 26D are corresponding cross-sectional views of an embodiment of a semiconductor device 201 along a third cut (e.g., cut D-D in FIG. 21A), which is along the lengthwise direction of the channel and parallel to the top surface of the substrate. Many aspects of the semiconductor device 201 are substantially similar to those of the semiconductor device 200. For the sake of convenience, reference numerals are repeated for ease of understanding. Some differences are discussed below.

Figure 15:
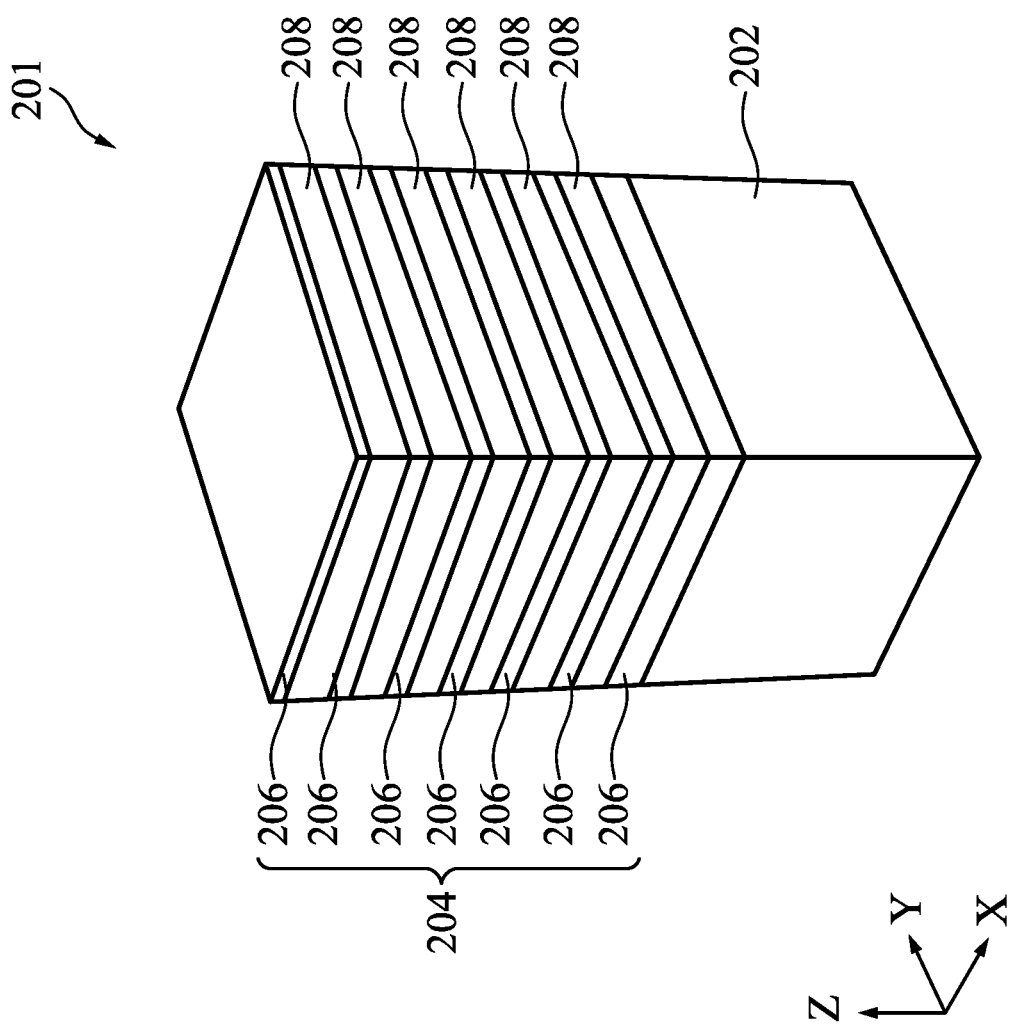
Figure 16:
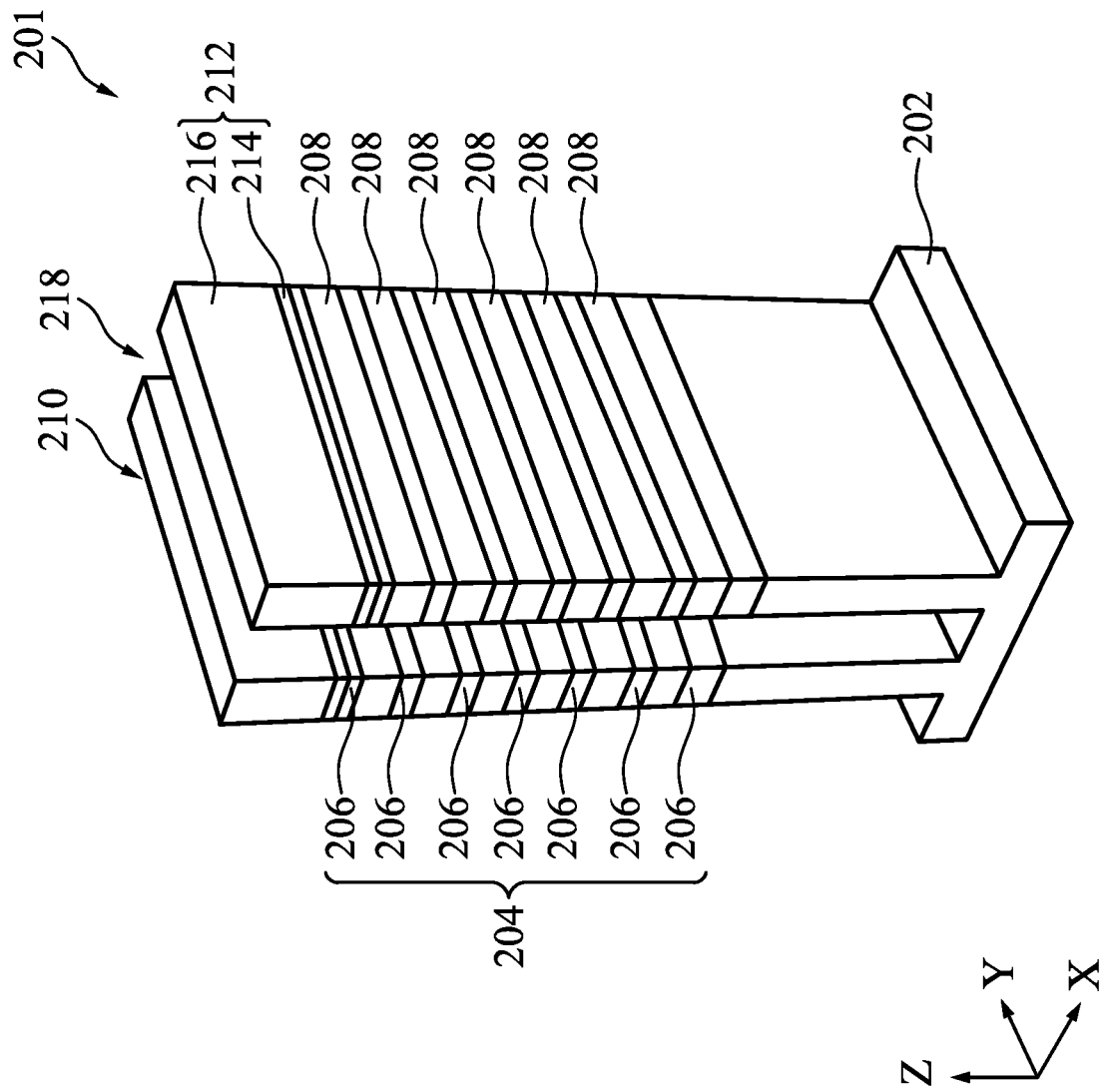
Figure 17:
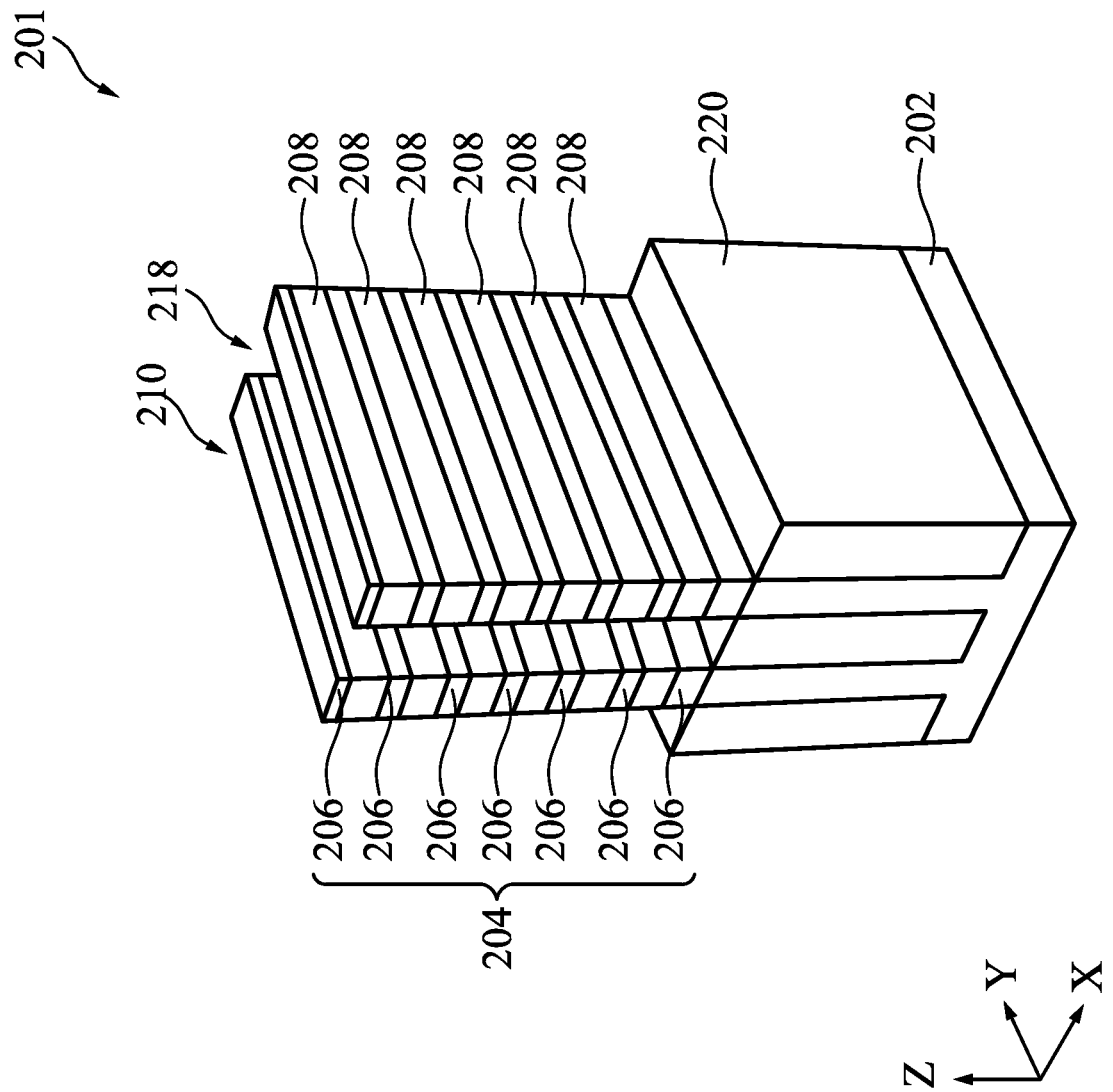
Figure 18:
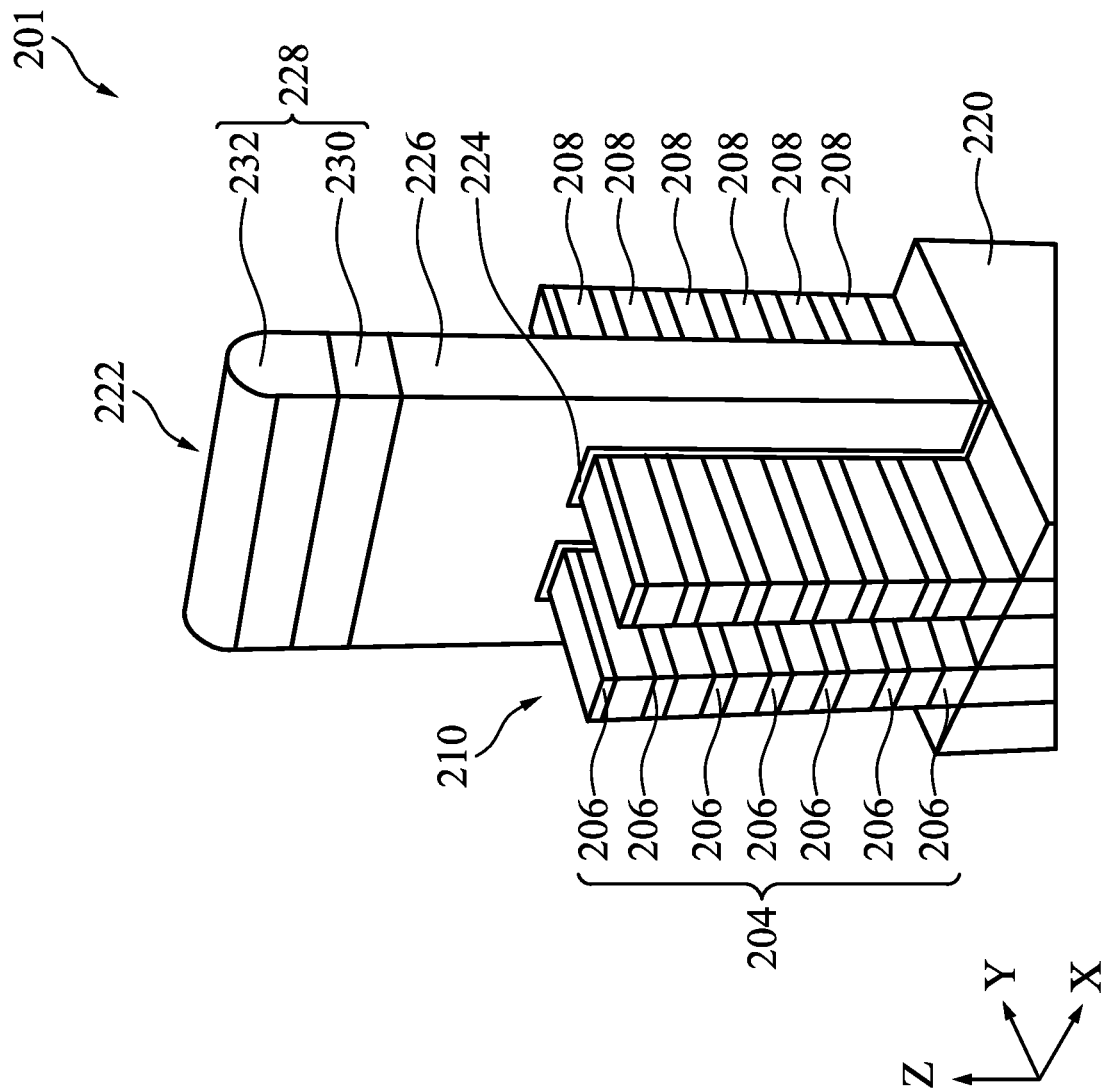
Figure 19:
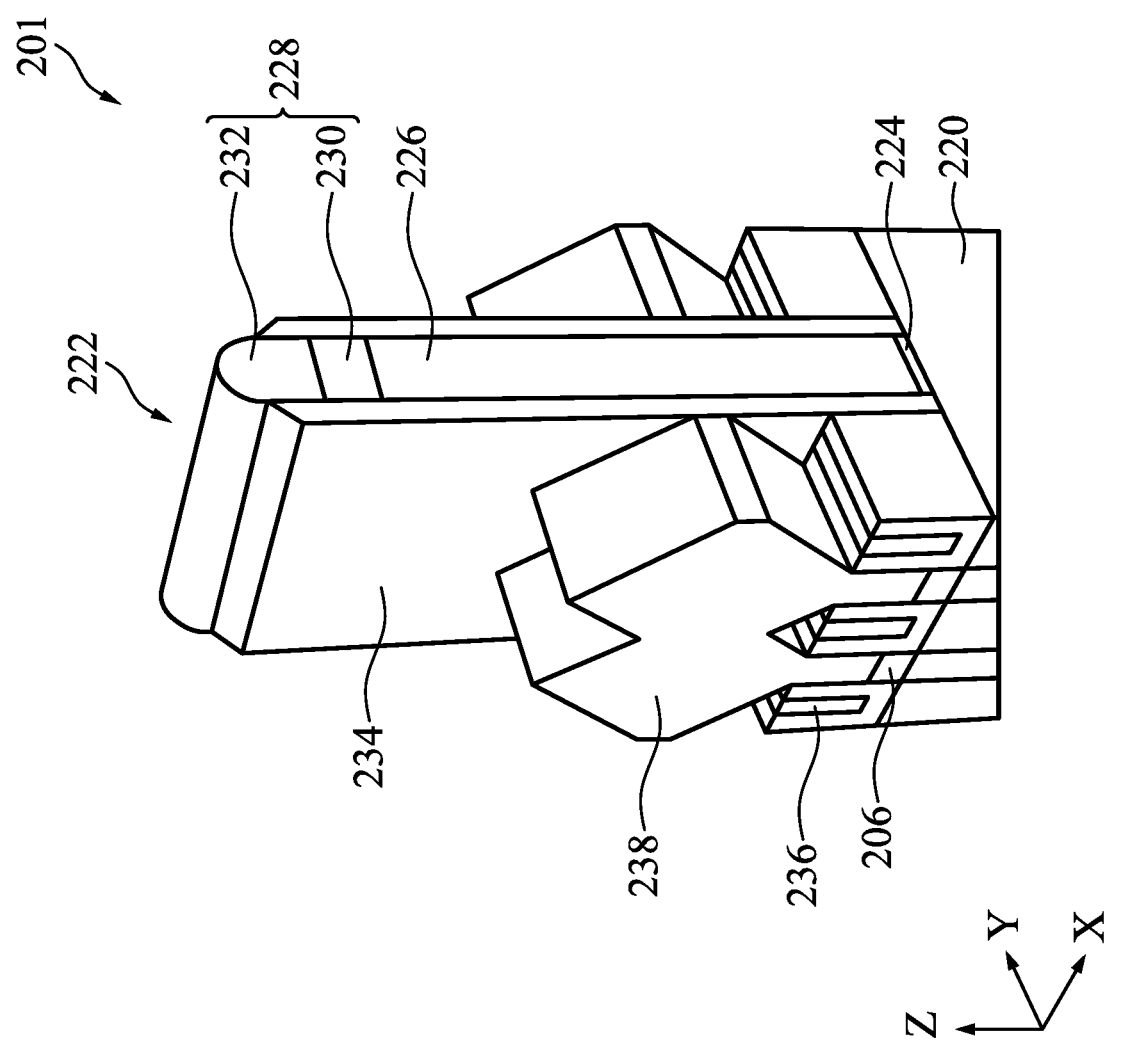
Figure 20:
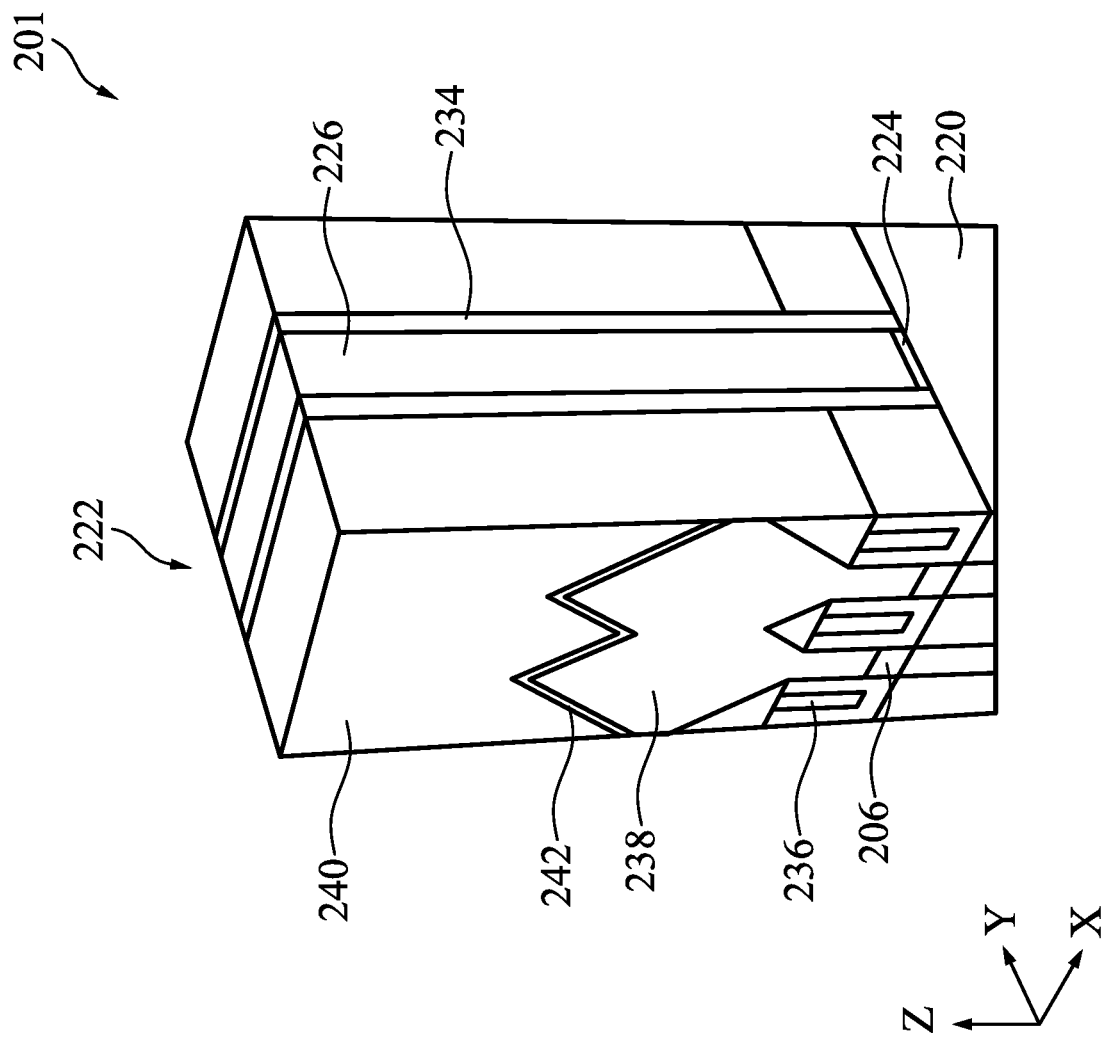
Figure 23A:
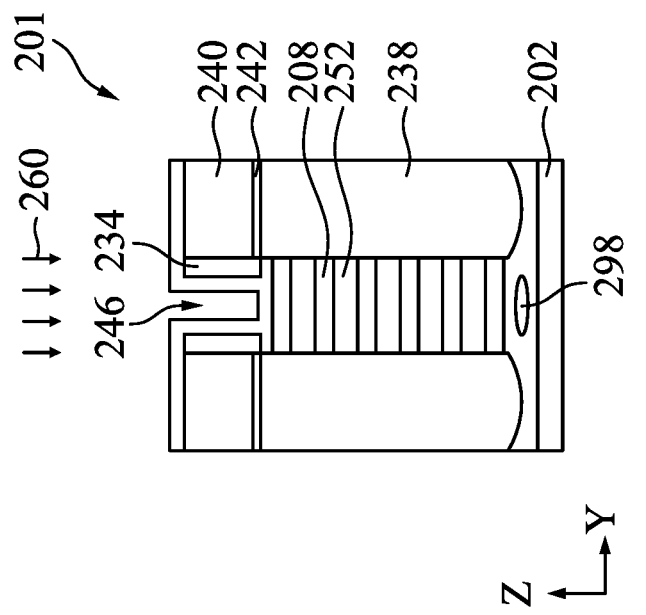
Figure 23B:
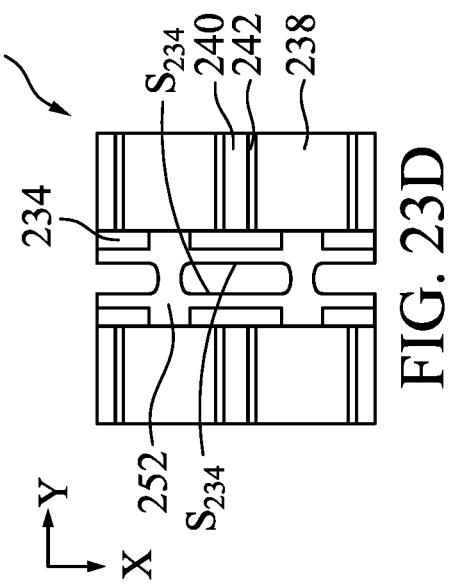
Figure 23C:
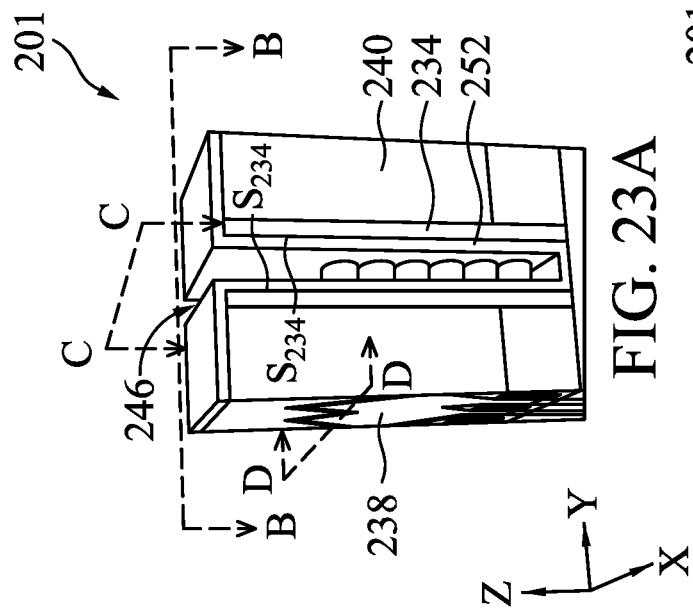
Figure 23D:
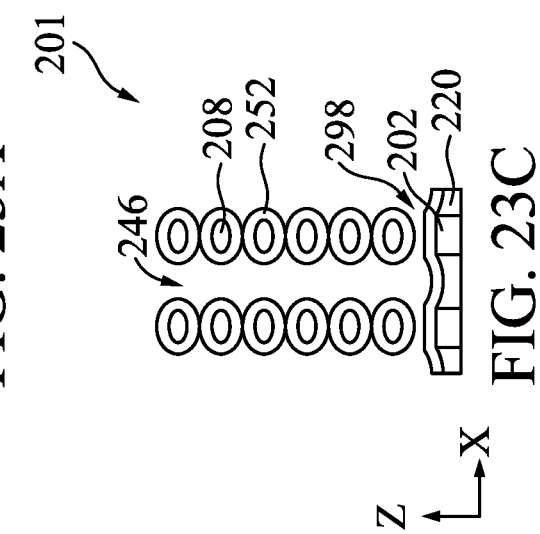

The method 1400 begins at step 1402 where a substrate is provided. Step 1402 may be substantially similar to step 102, discussed above with reference to the method 100 of FIG. 1A. Referring to FIG. 15, a substrate 202 is provided as discussed above.

The method 1400 proceeds to step 1404 where an epitaxial stack is provided. Step 1404 may be substantially similar to Step 104, discussed above with reference to the method 100 of FIG. 1A. Referring to FIG. 15, an epitaxial stack 204 is grown. The various material compositions of interleaved epitaxial layers 206 and 208 are similar to what have been discussed above with reference to the epitaxial stack 204 in FIG. 2. One difference is that the bottom epitaxial layer 206 has a thickness larger than other epitaxial layers 206 thereabove in the stack, such as about 1 nm to about 5 nm thicker. For example, other epitaxial layer 206 thereabove may have a uniform thickness about 5 nm, while the bottom epitaxial layer 206 may have a thickness from about 6 nm to about 10 nm. As a comparison, the epitaxial layers 208 of the stack are substantially uniform in thickness, such as from about 6 nm to about 12 nm. As will be shown, the bottom epitaxial layer 206 acts as a space holder for an inner sidewall material layer to replace which extends below S/D features, and the relatively larger thickness of the bottom epitaxial layer 206 facilitates filling in dielectric materials besides other benefits such as better gate to S/D isolation and better leakage suppression.

The method 1400 proceeds to step 1406 where one or more fins are patterned and formed. Step 1406 may be substantially similar to step 106, discussed above with reference to the method 100 of FIG. 1A. Referring to the example of FIG. 16, one or more fins 210 are provided as discussed above.

The method 1400 proceeds to step 1408 where STI features are formed. Step 1408 may be substantially similar to step 108, discussed above with reference to the method 100 of FIG. 1A. Referring to the example of FIG. 17, STI features 220 is deposited interposing the fins 210 and then recessed to expose the stack 204 as discussed above.

The method 1400 proceeds to step 1410 where a dummy gate structure is formed. Step 1410 may be substantially similar to step 110, discussed above with reference to the method 100 of FIG. 1A. Referring to the example of FIG. 18, a dummy gate structure 222 is disposed over a channel region of the fins 210 as discussed above.

The method 1400 proceeds to step 1412 where sidewall spacers are formed. Step 1410 may be substantially similar to step 112, discussed above with reference to the method 100 of FIG. 1A. Referring to the example of FIG. 19, sidewall spacers 234 is conformally deposited then anisotropically etched to cover sidewalls of the dummy gate structure 222 as discussed above.

The method 1400 proceeds to step 1414 where epitaxial S/D features 238 are formed in source/drain regions of the device 201. Forming the epitaxial S/D features 238 may include recessing fins 210 in S/D regions prior to epitaxially growing S/D features 238, similar to step 114 discussed above with reference to the method 100 of FIG. 1A. One difference is that during the recessing of the fins 210, the bottom epitaxial layer 206 of the stack 204 substantially remains, separating the epitaxial S/D features 238 from the substrate. For example, the alternating fashion between the different semiconductor materials of the epitaxial layers 206 and 208 allows an end mode etching to stop at the bottom epitaxial layer 206. Alternatively, a time mode etching may be applied to time the etching process to stop at the bottom epitaxial layer 206. The relatively larger thickness of the bottom epitaxial layer 206 also helps this layer to survive a time mode etching process. In some embodiments, in S/D regions, a top portion of the bottom epitaxial layer 206 may be recessed during the etching process (as shown in FIG. 21B).

The method 1400 proceeds to step 1416 where an interlayer dielectric layer is formed. Step 1416 may be substantially similar to step 116, discussed above with reference to the method 100 of FIG. 1A. Referring to the example of FIG. 20, an ILD layer 240 is formed as discussed above. A CESL layer 242 may be formed prior to the forming of the ILD layer 240.

The method 1400 proceeds to step 1418 where a dummy gate removal is performed. Step 1418 may be substantially similar to step 118, discussed above with reference to the method 100 of FIG. 1B. Referring to the example of FIGS. 21A-21D, the dummy gate structure 222 is removed to form a gate trench 246 between two opposing sidewalls $S_{234}$ of the sidewall spacers 234 as discussed above.

The method 1400 proceeds to step 1420 where the sacrificial epitaxial layers are removed. Step 1420 may be substantially similar to step 120, discussed above with reference to the method 100 of FIG. 1B. Referring to the example of FIGS. 22A-22D, epitaxial layers 206 in the channel region are removed in an etching process, including the bottom layer. The removal process "releases" the nanowires in the channel region (e.g., epitaxial layers 208) as discussed above. Furthermore, the bottom layer 206 in the S/D region is also removed, forming a cavity under the S/D features 238 continuously extending from one S/D region to opposing S/D region.

The method 1400 proceeds to step 1422 where an inner spacer material layer is conformally deposited in the gate trench. Step 1422 may be substantially similar to step 122, discussed above with reference to the method 100 of FIG. 1B. Referring to the example of FIGS. 23A-23D, the inner spacer material layer 252 is conformally deposited on opposing sidewalls $S_{234}$ of the sidewall spacers 234 and over the substrate 202. The inner spacer material layer 252 also wraps over each of the epitaxial layers 208 in the channel region. Furthermore, the inner spacer material layer 252 also fills the cavities directly under the S/D features 238. To be noticed, due to the relatively larger gap between the bottom epitaxial layer 208 and the substrate 202 (due to the thicker bottom epitaxial layer 206 described above), a void 298 may remain in the channel region between the bottom epitaxial layer 208 and the substrate 202. In some alternative embodiments, the region of the otherwise void 298 is filled up with the inner spacer material layer 252 (not shown).

Figure 24A:
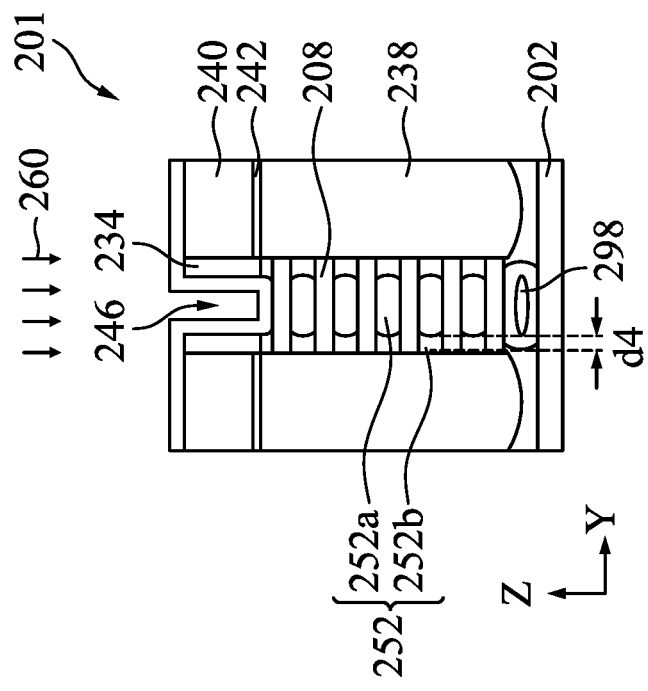
Figure 24B:
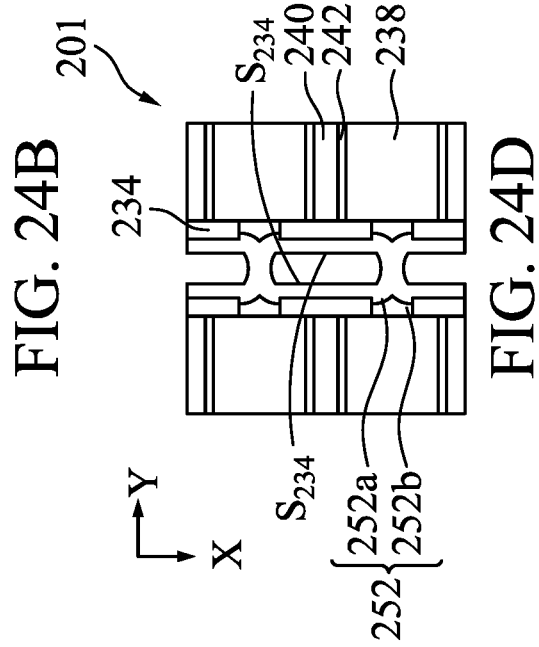
Figure 24C:
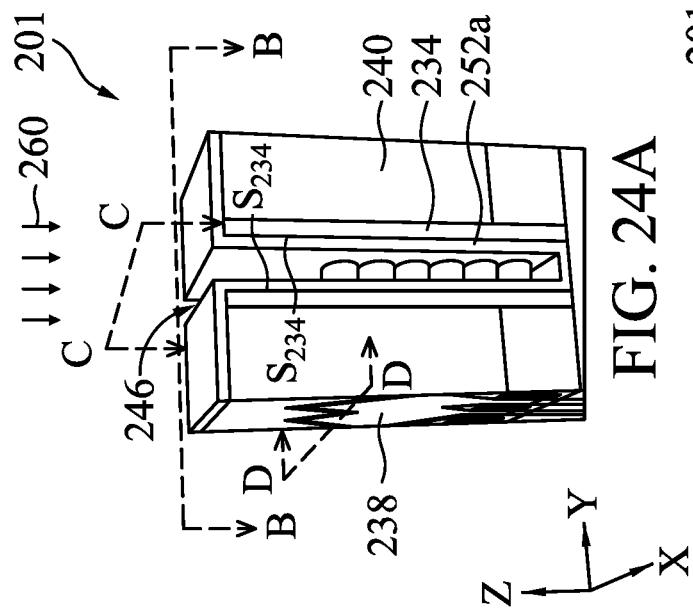
Figure 24D:
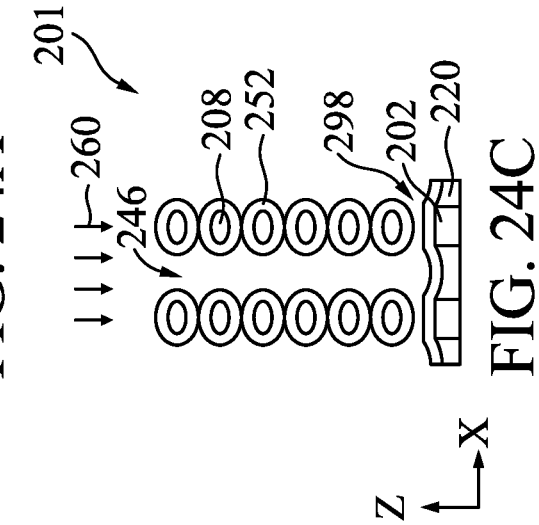

The method 1400 proceeds to step 1424 where a treatment process is performed towards the inner spacer material layer. Step 1424 may be similar to step 124, discussed above with reference to the method 100 of FIG. 1B. Referring to the example of FIGS. 24A-24D, the treatment process may be an oxygen ashing process, a nitridation process, or an annealing process using the sidewall spacers 234 as a treatment mask. A middle portion of the inner spacer material layer 252 between two opposing sidewalls $S_{234}$ of the sidewall spacers 234 (denoted as portion 252a) receives the treatment process 260, resulting in a material composition change, such that an etch selectivity exhibits compared to other parts of the inner spacer material layer 252 (denoted as portion 252b). As illustrated in FIG. 24B, the middle portion 252a between the bottom epitaxial layer 208 and the substrate 202 has larger width than other portions 252a above, due to its larger correctional area and therefore wider lateral diffusion. In some embodiment, in the Y-direction, the middle portion 252a between the bottom epitaxial layer 208 and the substrate 202 has an extra width $d_4$ on each side for about 0.5 nm to about 5 nm.

The method 1400 proceeds to step 1426 where the middle portion of the inner spacer material layer receiving the treatment process is selectively removed. Step 1426 may be similar to step 126, discussed above with reference to the method 100 of FIG. 1B. Referring to the example of FIGS. 25A-25D, portions 252b of the inner spacer material layer 252 remains as inner spacers. The inner spacers provide isolation between the epitaxial S/D features 238 and the high-K/metal gate to be formed in the gate trench 246. Furthermore, portions 252b also remain vertically between the epitaxial S/D features 238 and the substrate 202 to provide isolation therebetween.

The method 1400 proceeds to step 1428 where a gate structure (e.g., replacement gate structure, HK MG structure) is formed. Step 1428 may be substantially similar to step 128, discussed above with reference to the method 100 of FIG. 1B. Referring to the example of FIGS. 26A-26D, a gate structure 280 is formed including an interfacial layer 282, a high-K gate dielectric layer 284, and a gate electrode layer 286. In an embodiment, portion of the gate structure 280 between the bottom epitaxial layer 208 and the substrate 202 is laterally wider than other portions thereabove, such as about 0.5 nm to about 5 nm wider on each end ($d_4$). The inner spacers 252b provide isolation between the epitaxial S/D features 238 and the HK MG stack 280, as well as between the epitaxial S/D features 238 and the substrate 202.

Although not intended to be limiting, one or more embodiments of the present disclosure provide many benefits to a semiconductor device and the formation thereof. For example, embodiments of the present disclosure provide a self-aligned inner spacer formation method so as to accurately control uniformity of the inner spacers. As a bench mark of uniformity, the overall thickness variation (from top to bottom) of the inner spacers may be within ±5% in some embodiments (also termed as substantially uniform thickness). The uniformity of the inner spacers helps to improve channel length uniformity across different layers of the nanosheets in a multi-gate semiconductor device (e.g., GAA device). The inner spacers may also provide isolation between S/D regions and the gate stack, and also between S/D regions and the substrate. Furthermore, the inner spacer formation method can be easily integrated into existing semiconductor fabrication processes.

In one exemplary aspect, the present disclosure is directed to a method. The method includes forming a fin extruding from a substrate, the fin having a plurality of sacrificial layers and a plurality of channel layers, wherein the sacrificial layers and the channel layers are alternately arranged; removing a portion of the sacrificial layers from a channel region of the fin; depositing a spacer material in areas from which the portion of the sacrificial layers have been removed; removing a portion of the spacer material, thereby exposing the channel layers in the channel region of the fin, wherein other portions of the spacer material remain as a spacer feature; and forming a gate structure engaging the exposed channel layers. In some embodiments, the method further includes prior to the removing of the portion of the spacer material, performing a treatment process to the portion of the spacer material, such that the portion of the spacer material has an etching selectivity compared to the other portions of the spacer material. In some embodiments, the treatment process includes an oxygen ashing process or a nitridation process. In some embodiments, the treatment process includes an annealing process. In some embodiments, the method further includes prior to the removing of the portion of the sacrificial layers, forming an outer spacer layer, wherein the spacer material is in physical contact with the outer spacer layer, and wherein the spacer feature has a thickness approximately equal to that of the outer spacer layer. In some embodiments, a sidewall surface of the spacer feature has a convex shape in a plane parallel to a top surface of the substrate, the convex shape having an apex extending towards the gate structure. In some embodiments, a sidewall surface of the spacer feature has a concave shape in a plane perpendicular to a top surface of the substrate and along a lengthwise direction of the fin, the concave shape bending away from the gate structure. In some embodiments, the method further includes forming a source/drain (S/D) feature, wherein the spacer feature interposes the S/D feature and the gate structure. In some embodiments, the S/D feature is formed on a bottommost one of the plurality of sacrificial layers. In some embodiments, the bottommost one of the plurality of sacrificial layers has a greater thickness than any other sacrificial layers. In some embodiments, the plurality of sacrificial layers includes silicon germanium and the plurality of channel layers includes silicon.

In another exemplary aspect, the present disclosure is directed to a method of fabricating a semiconductor device. The method includes forming a stack of a first type and a second type epitaxial layers on a semiconductor substrate, the first type and second type epitaxial layers having different material compositions and the first type and second type epitaxial layers being alternatingly disposed in a vertical direction; forming a dummy gate covering a portion of the stack in a channel region; forming an outer spacer layer covering sidewalls of the dummy gate; removing the dummy gate to from a gate trench, wherein the gate trench exposes opposing sidewalls of the outer spacer layer; etching the second type epitaxial layers in the gate trench; depositing a dielectric layer in the gate trench along the opposing sidewalls of the outer spacer layer and wrapping around the first type epitaxial layers; performing a treatment process to a portion of the dielectric layer between the opposing sidewalls of the outer spacer layer, wherein the treatment process uses the outer spacer layer as a treatment mask; removing the portion of the dielectric layer, thereby forming an inner spacer layer; and forming a gate stack in the gate trench and wrapping around the first type epitaxial layers. In some embodiments, the treatment process includes an oxidization treatment or a nitridation treatment. In some embodiments, the treatment process includes an annealing process. In some embodiments, the dielectric layer is deposited conformally in the gate trench. In some embodiments, after the depositing of the dielectric layer, a void remains under a bottom first type epitaxial layer. In some embodiments, the outer spacer layer and the inner spacer layer include different dielectric materials.

In yet another exemplary aspect, the present disclosure is directed to a multi-gate semiconductor device. The multi-gate semiconductor device includes a fin element extending upwardly from a substrate; a gate structure over the fin element; an epitaxial source/drain (S/D) feature adjacent the fin element; and a dielectric spacer interposing the gate structure and the epitaxial S/D feature, wherein a sidewall surface of the dielectric spacer facing the gate structure has a convex shape in a plane parallel to a top surface of the substrate, the convex shape having an apex extending towards the gate structure. In some embodiments, the multi-gate semiconductor device further includes a gate spacer covering sidewalls of the gate structure, wherein the dielectric spacer has a thickness substantially equal to that of the gate spacer. In some embodiments, the dielectric spacer has a substantially uniform thickness.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin extruding from a substrate, the fin having a plurality of sacrificial layers and a plurality of channel layers, wherein the sacrificial layers and the channel layers are alternately arranged;
    removing a portion of the sacrificial layers from a channel region of the fin;
    depositing a spacer material in areas from which the portion of the sacrificial layers have been removed;
    removing a portion of the spacer material, thereby exposing the channel layers in the channel region of the fin, wherein other portions of the spacer material remain as a spacer feature; and
    forming a gate structure engaging the exposed channel layers.

2. The method of claim 1, further comprising:
    prior to the removing of the portion of the spacer material, performing a treatment process to the portion of the spacer material, such that the portion of the spacer material has an etching selectivity compared to the other portions of the spacer material.

3. The method of claim 2, wherein the treatment process includes an oxygen ashing process or a nitridation process.

4. The method of claim 2, wherein the treatment process includes an annealing process.

5. The method of claim 1, further comprising:
    prior to the removing of the portion of the sacrificial layers, forming an outer spacer layer, wherein the spacer material is in physical contact with the outer spacer layer, and wherein the spacer feature has a thickness approximately equal to that of the outer spacer layer.

6. The method of claim 1, wherein a sidewall surface of the spacer feature has a convex shape in a plane parallel to a top surface of the substrate, the convex shape having an apex extending towards the gate structure.

7. The method of claim 1, wherein a sidewall surface of the spacer feature has a concave shape in a plane perpendicular to a top surface of the substrate and along a lengthwise direction of the fin, the concave shape bending away from the gate structure.

8. The method of claim 1, further comprising:
forming a source/drain (S/D) feature, wherein the spacer feature interposes the S/D feature and the gate structure.

9. The method of claim 8, wherein the forming of the S/D feature is prior to the depositing of the spacer material.

10. The method of claim 1, wherein the plurality of sacrificial layers includes silicon germanium and the plurality of channel layers includes silicon.

11. A method of fabricating a semiconductor device, comprising:
forming a stack of a first type and a second type epitaxial layers on a semiconductor substrate, the first type and second type epitaxial layers having different material compositions and the first type and second type epitaxial layers being alternatingly disposed in a vertical direction;
forming a dummy gate covering a portion of the stack in a channel region;
forming an outer spacer layer covering sidewalls of the dummy gate;
removing the dummy gate to form a gate trench, wherein the gate trench exposes opposing sidewalls of the outer spacer layer;
etching the second type epitaxial layers in the gate trench;
depositing a dielectric layer in the gate trench along the opposing sidewalls of the outer spacer layer and wrapping around the first type epitaxial layers;
performing a treatment process to a portion of the dielectric layer between the opposing sidewalls of the outer spacer layer, wherein the treatment process uses the outer spacer layer as a treatment mask;
removing the portion of the dielectric layer, thereby forming an inner spacer layer; and
forming a gate stack in the gate trench and wrapping around the first type epitaxial layers.

12. The method of claim 11, wherein the treatment process includes an oxidization treatment or a nitridation treatment.

13. The method of claim 12, wherein the treatment process includes an annealing process.

14. The method of claim 11, wherein the dielectric layer is deposited conformally in the gate trench.

15. The method of claim 11, wherein the outer spacer layer and the inner spacer layer include different dielectric materials.

16. A method of manufacturing a semiconductor device, comprising:
forming a fin structure extruding from a substrate, the fin structure having first semiconductor layers and second semiconductor layers alternately stacked;
forming a sacrificial gate structure over the fin structure;
removing the sacrificial gate structure to form a gate trench;
etching the second semiconductor layers exposed in the gate trench;
depositing a dielectric layer in the gate trench, wherein the dielectric layer wraps around the first semiconductor layers;
performing a treatment process to a middle portion of the dielectric layer;
removing the middle portion of the dielectric layer from the gate trench, wherein end portions of the dielectric layer remain; and
forming a gate stack in the gate trench engaging the first semiconductor layers.

17. The method of claim 16, wherein the treatment process alters an etching selectivity of the middle portion of the dielectric layer.

18. The method of claim 16, wherein the treatment process includes an oxidization treatment or a nitridation treatment.

19. The method of claim 16, wherein the treatment process includes an annealing process.

20. The method of claim 16, further comprising:
prior to the removing of the sacrificial gate structure, forming a source/drain (S/D) feature, wherein the end portions of the dielectric layer are in physical contact with the S/D feature.

* * * * *